(12) United States Patent
Dennison

(10) Patent No.: US 6,969,633 B2
(45) Date of Patent: Nov. 29, 2005

(54) LOWER ELECTRODE ISOLATION IN A DOUBLE-WIDE TRENCH AND METHOD OF MAKING SAME

(75) Inventor: Charles Dennison, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/652,631

(22) Filed: Aug. 29, 2003

(65) Prior Publication Data

US 2004/0042329 A1    Mar. 4, 2004

Related U.S. Application Data

(62) Division of application No. 09/749,127, filed on Dec. 26, 2000, now Pat. No. 6,646,297.

(51) Int. Cl.[7] ............................................. H01L 21/00
(52) U.S. Cl. ......................... 438/95; 438/430; 438/433
(58) Field of Search .......................... 438/95, 128, 430, 438/433, 453, 659

(56) References Cited

U.S. PATENT DOCUMENTS 6,215,140 B1 *  4/2001  Reisinger et al. ........... 257/296
6,569,705 B2 *  5/2003  Chiang et al. ................ 438/95

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

\* cited by examiner

Primary Examiner—David Nelms
Assistant Examiner—Quoc Hoang
(74) Attorney, Agent, or Firm—Trop, Pruner & Hu, P.C.

(57) ABSTRACT

The invention relates to a phase-change memory device. The device includes a double-wide trench into which a single film is deposited but two isolated lower electrodes are formed therefrom. Additionally a diode stack is formed that communicates to the lower electrode. Additionally, other isolated lower electrodes may be formed along a symmetry line that is orthogonal to the first two isolated lower electrodes. The present invention also relates to a method of making a phase-change memory device. The method includes forming two orthogonal and intersecting isolation structure s around a memory cell structure diode stack.

5 Claims, 23 Drawing Sheets

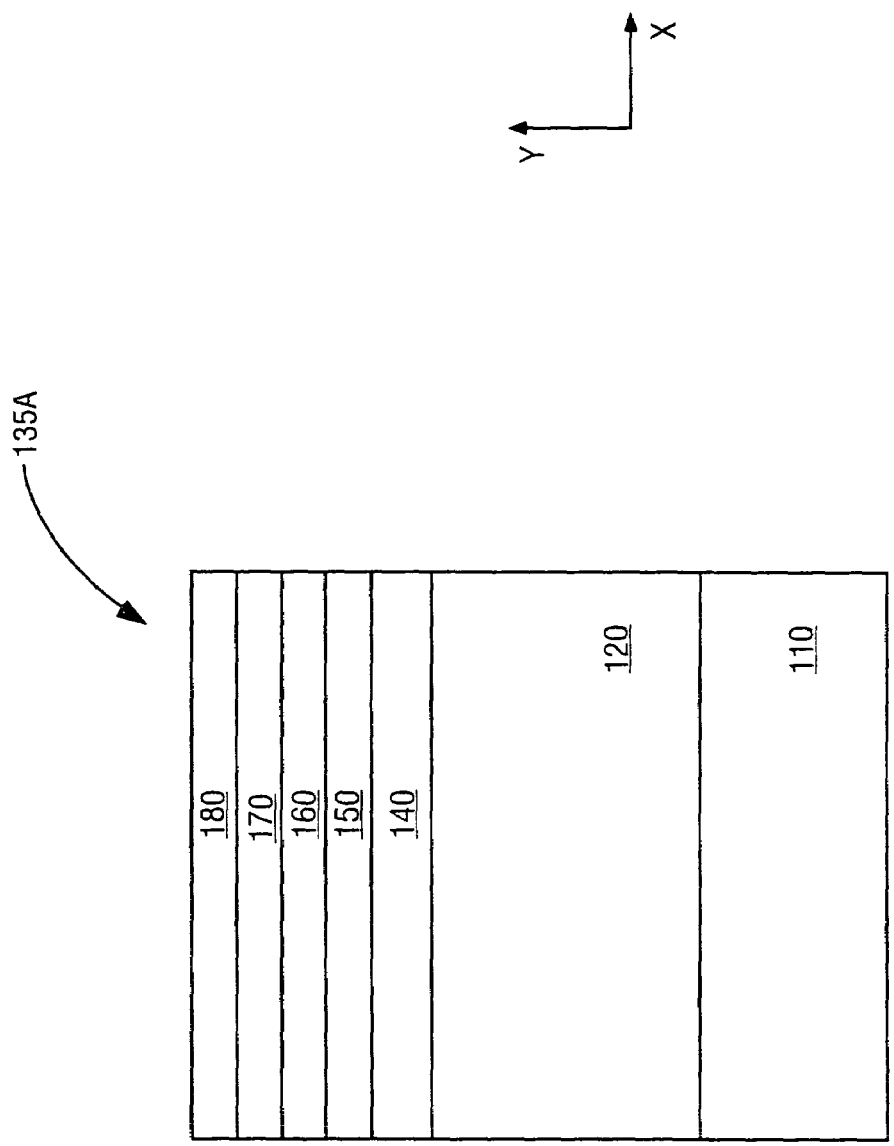

US 6,969,633 B2

LOWER ELECTRODE ISOLATION IN A DOUBLE-WIDE TRENCH AND METHOD OF MAKING SAME

This is a divisional of prior application Ser. No. 09/749,127, filed Dec. 26, 2000 now U.S. Pat. No. 6,646,297.

BACKGROUND OF THE INVENTION

1. Field of the Invention

The present invention relates to a phase-change memory device. More particularly, the present invention relates isolation of an electrically conductive film in the memory device. In particular, the present invention relates to an undoped region in a double-wide lower electrode that spans two diode stacks in a phase-change memory device.

2. Description of Related Art

As microelectronic technology progresses, the need has arisen for new data retention schemes. One such data retention scheme is the chalcogenide phase-change technology. Typically, a phase-change memory device includes a polysilicon lower electrode, also known as a "matchstick".

One challenge of forming a lower electrode in a phase-change memory cell is to shrink the cell size while still being able to dope the polysilicon matchstick structure in an ever-increasing aspect ratio recess. As the aspect ratio of the recess increases, it becomes increasingly difficult to properly dope the matchstick structure for at least two reasons. First, an increasingly steep angle of implantation directed at the polysilicon wall will result in an increasingly higher incidence of ricochet of the dopants instead of implantation. Second, as that aspect ratio gets higher, it becomes increasingly difficult to get dopant to strike the polysilicon wall at the bottom of the recess; an inadequate doping at the bottom results in a conductive failure.

Another challenge of forming a lower electrode in a phase-change memory cell is to shrink the cell size while not increasing capacitive coupling between a given memory cell and a contiguous memory cell.

Another process challenge is the singulation of the lower electrode film in order to achieve discrete conductive electrodes without decreasing process yield. Typically, a masking and etching operation is carried out that etches away polysilicon that will not be located within a given memory cell footprint.

Another challenge for a phase-change memory device is power consumption required in setting and resetting memory material. Power consumption is significant, particularly in portable devices such as a hand-held or wireless device.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 6 shows the cross-section of the structure of FIG. 4 through line B–B';

DETAILED DESCRIPTION OF THE INVENTION

The invention relates to a memory device that is used with phase-change material to memorialize data storage. The device uses a lower electrode material that is referred to as a "matchstick". Beneath the matchstick, an active area that may be a diode stack is provided to activate the lower electrode. A first isolation trench may be formed, followed by formation of a second isolation trench. The second isolation trench is orthogonal to the first isolation trench. The lower electrode is formed over the diode stack portion of the memory cell structure, and a volume of phase change memory material is disposed above the matchstick. Either a high resistivity metal compound may be used as the lower electrode, or a polysilicon compound may be used.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
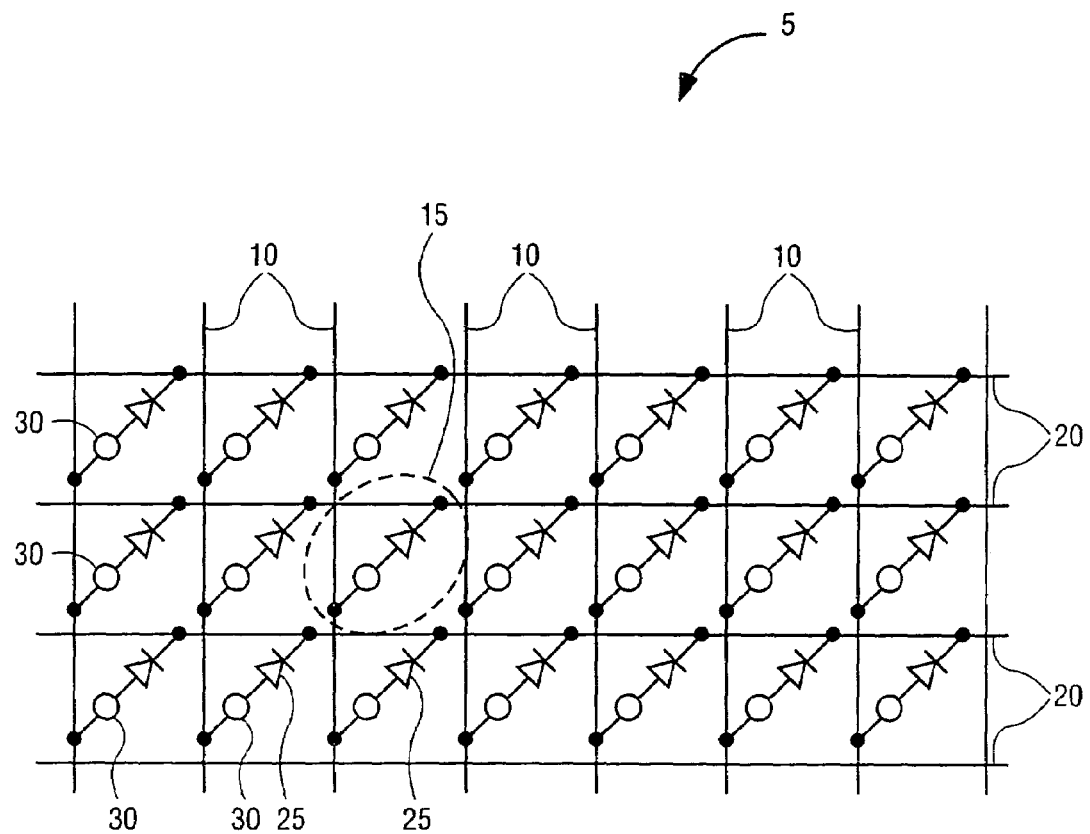
FIG. 1 is a schematic diagram of an array of memory elements according to an embodiment of the invention.

FIG. 1 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art. One purpose of the array of memory elements in combination with isolation devices is to enable each discrete memory element to be read and written without interfering with the information stored in adjacent or remote memory elements of the array.

A memory array such as memory array 5 may be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

Figure 2:
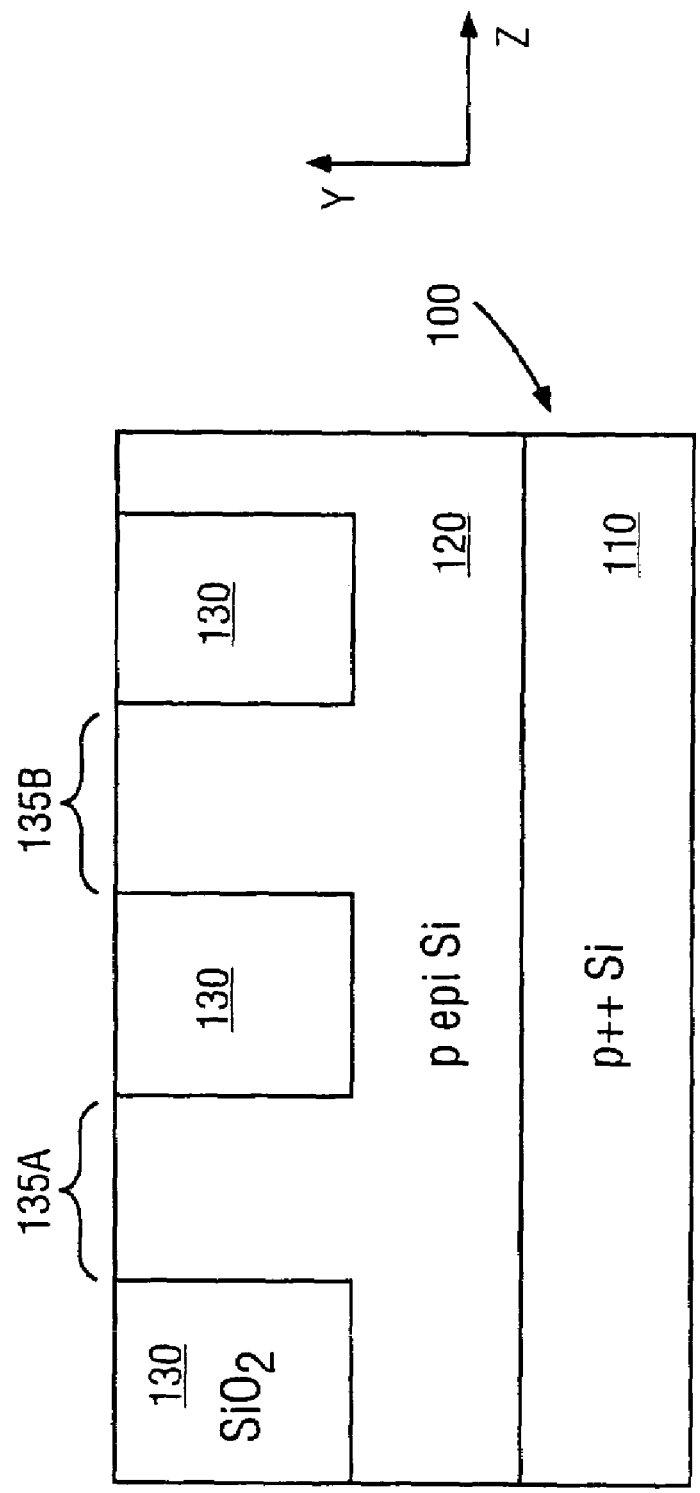
FIG. 2 schematically illustrates a cross-sectional planar side view of a portion of a semiconductor substrate having a first shallow trench isolation (STI) structure formed in trenches that define a z-direction thickness of a memory cell in accordance with one embodiment of the invention.

FIGS. 2–23 illustrate the fabrication of representative memory element 15 of FIG. 1 according to various embodiments. FIG. 2 shows a portion of substrate 100 that is, for example, a semiconductor substrate. In this example, a P-type dopant such as boron is introduced in a deep portion 110. In one example, a suitable concentration of P-type dopant is on the order of above $5 \times 10^{19}$–$1 \times 10^{20}$ atoms per cubic centimeters (atoms/cm$^3$) rendering deep portion 110 of substrate 100 representatively P$^{++}$. Overlying deep portion 110 of substrate 100, in this example, is an epitaxial portion 120 of P-type epitaxial silicon. In one example, the dopant concentration in epitaxial portion 120 is on the order of about $10^{16}$–$10^{17}$ atoms/cm$^3$. The introduction and formation of epitaxial portion 120 as P-type, and deep portion 110 as a P++ type portion may follow techniques known to those of skill in the art.

FIG. 2 also shows first shallow trench isolation (STI) structures 130 formed in epitaxial portion 120 of substrate 100. As will become apparent in the subsequent discussion, first STI structures 130 serve, in one aspect, to define the z-direction thickness of a memory cell structure diode stack, with at this point only the z-direction thickness of a memory element cell defined. In another aspect, first STI structures 130 serve to isolate individual memory elements in one dimension, from one another as well as associated circuit elements such as transistor devices formed in and on substrate 100. First STI structures 130 are formed according to techniques known to those skilled in the art.

Figure 3:
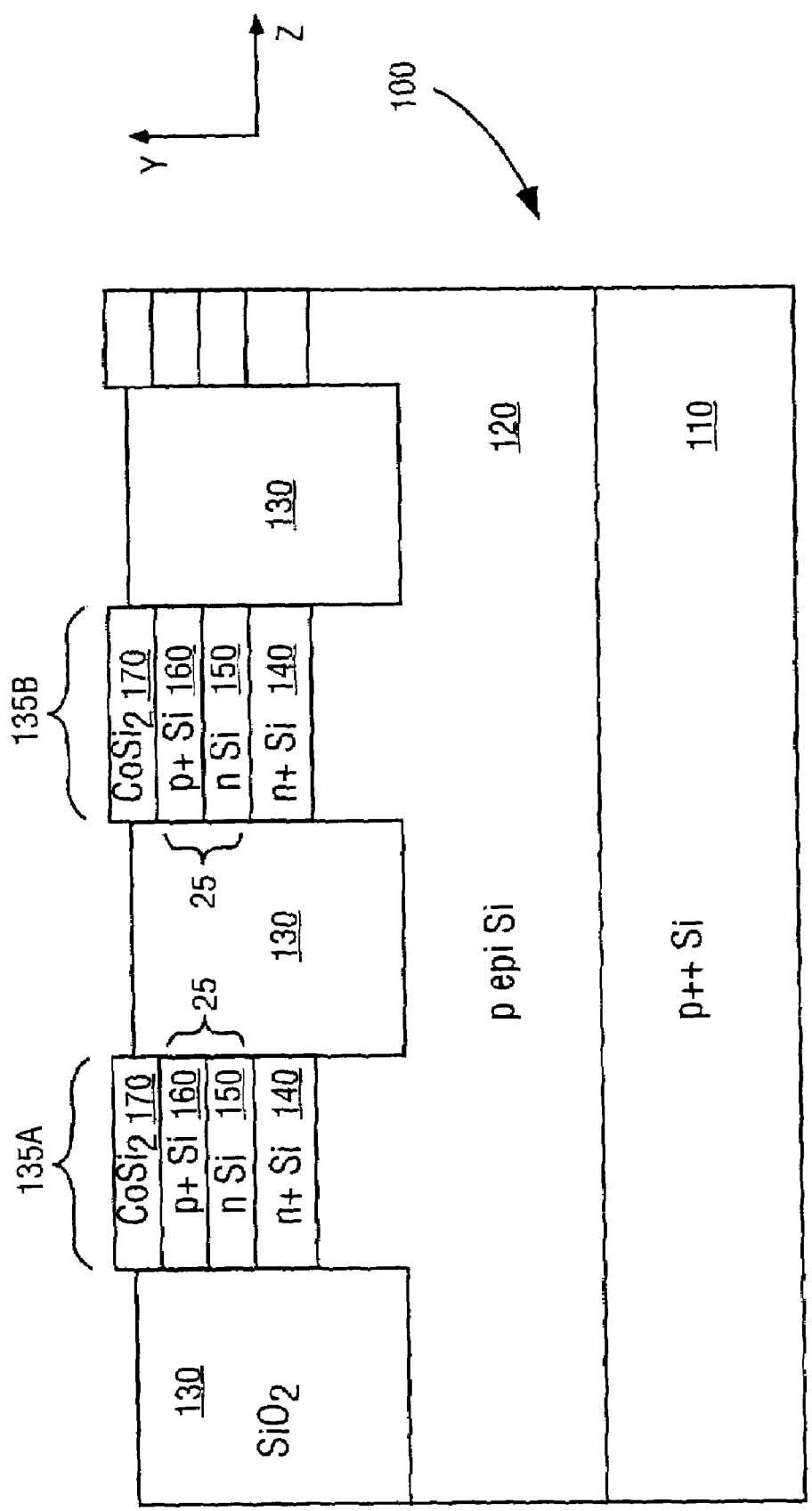
FIG. 3 shows the structure of FIG. 2, through the same cross-sectional view, after the introduction of dopants to form a diode stack portion of a memory cell structure in accordance with one embodiment of the invention.

FIG. 3 shows the structure of FIG. 2 after a further fabrication operation in memory cell regions 135A and 135B. Memory cell regions 135A and 135B may be referred to as first and second areas, respectively, or as first and second active areas, respectively. In one embodiment, memory cell regions 135A and 135B are introduced as strips with the x-direction dimension thereof greater than the z-direction dimension. Overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}$–$10^{19}$ atoms/cm$^3$ such as N$^+$ silicon. In this example, first conductor or signal line material 140 serves as an address line, a row line such as row line 20 of FIG. 1. Overlying first conductor or signal line material 140 is an isolation device such as isolation device 25 of FIG. 1. In one example, isolation device 25 is a PN diode formed of N-type silicon portion 150 that may have a dopant concentration on the order of about $10^{17}$–$10^{18}$ atoms/cm$^3$ and P-type silicon portion 160 that may have a dopant concentration on the order of about $10^{19}$–$10^{20}$ atoms/cm$^3$. Although a PN diode 25 is shown, it is to be appreciated that other isolation structures are similarly suitable. Such isolation devices include, but are not limited to, MOS devices.

Referring to FIG. 3, overlying isolation device 25 in memory cell regions 135A and 135B is a reducer material 170 of, in this example, a refractory metal silicide such as cobalt silicide (CoSi$_2$). Reducer material 170 may be formed at any one of several portions of the inventive process. When reducer material 170 is a metal silicide, it may be formed in place as a self-aligned silicide or salicide. Reducer material 170 may be formed at this portion of the process or it may be formed later. Reducer material 170, in one aspect, serves as a low resistance material in the fabrication of peripheral circuitry such as addressing circuitry of the circuit structure on the chip. Thus, reducer material 170 may not be required in terms of forming a memory element as described. Nevertheless, because of its low resistance property, its inclusion as part of the memory cell structure between isolation device 25 and memory element 30 is utilized in this embodiment.

Figure 4:
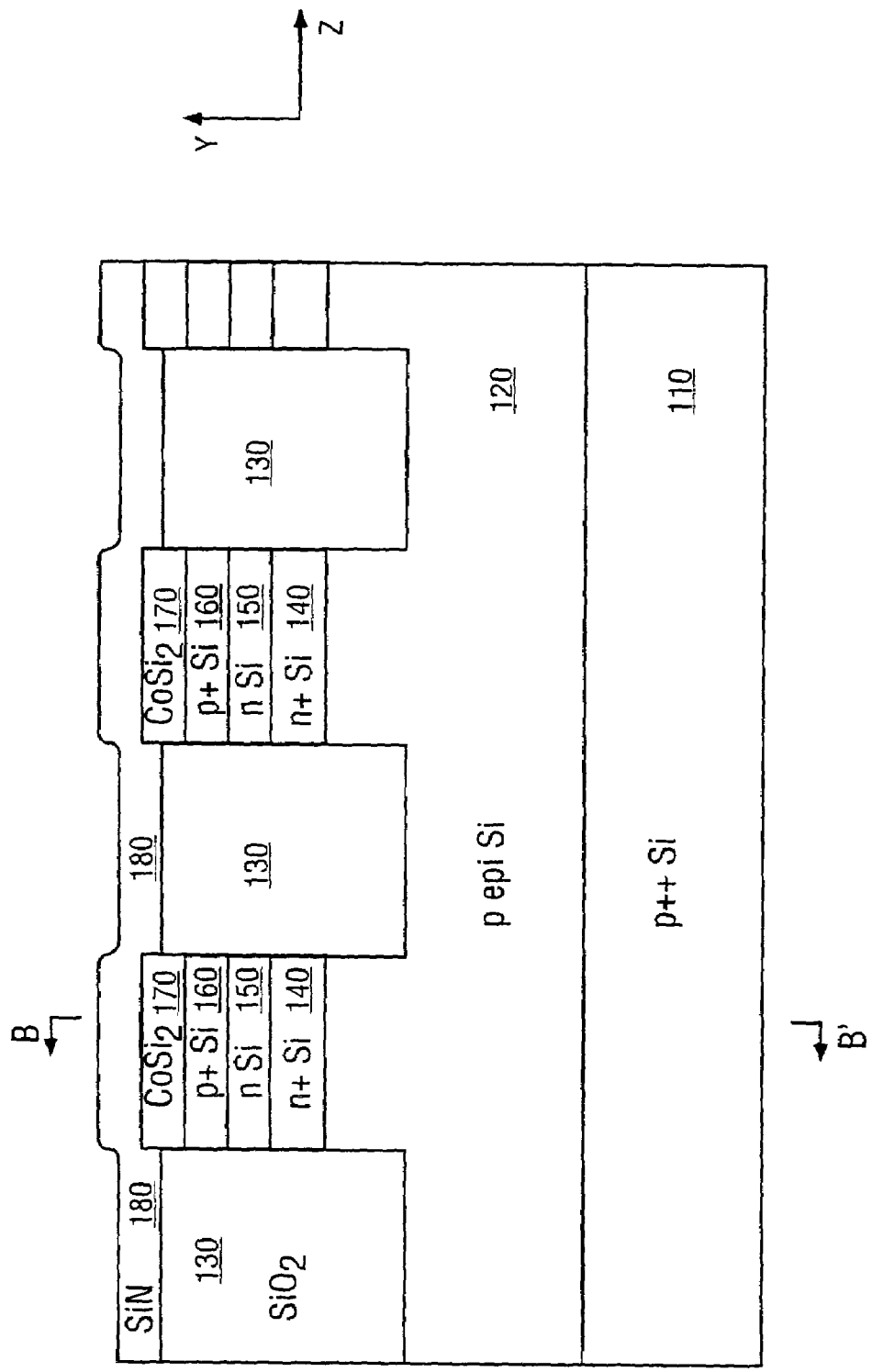
FIG. 4 shows the structure of FIG. 3 after the introduction of a masking material over the memory cell structure in accordance with one embodiment of the invention.
Figure 5:
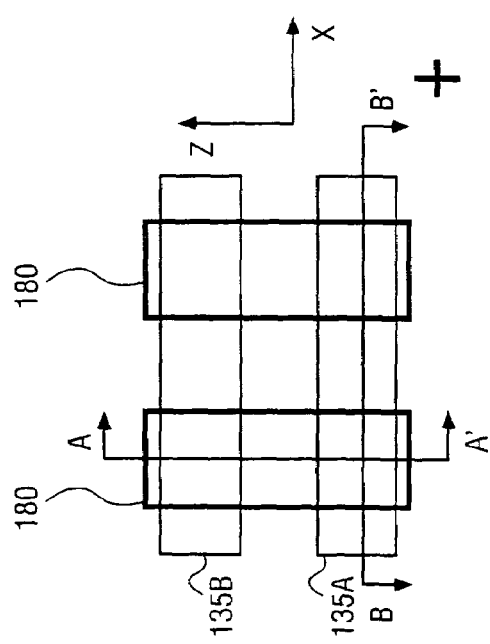
FIG. 5 shows a schematic top view of the structure of FIG. 4.

FIG. 4 shows the structure of FIG. 3 after the introduction of a masking material 180. As will become clear later, masking material 180 may serve as patterning to protect memory cell regions 135A as well as to protect portions of first STI structures 130 for a subsequent etch operation. FIG. 5 schematically shows memory cell regions 135A and 135B in an xz plane. Overlying the memory cell is masking material 180. FIG. 6 shows a cross-sectional side view of memory cell region 135A through line B–B' of FIG. 5 in an xy perspective. In one embodiment, a suitable material for masking material 180 is a dielectric material such as silicon nitride ($Si_3N_4$) or the like although other material may be used such as an organic resist or the like.

Figure 7:
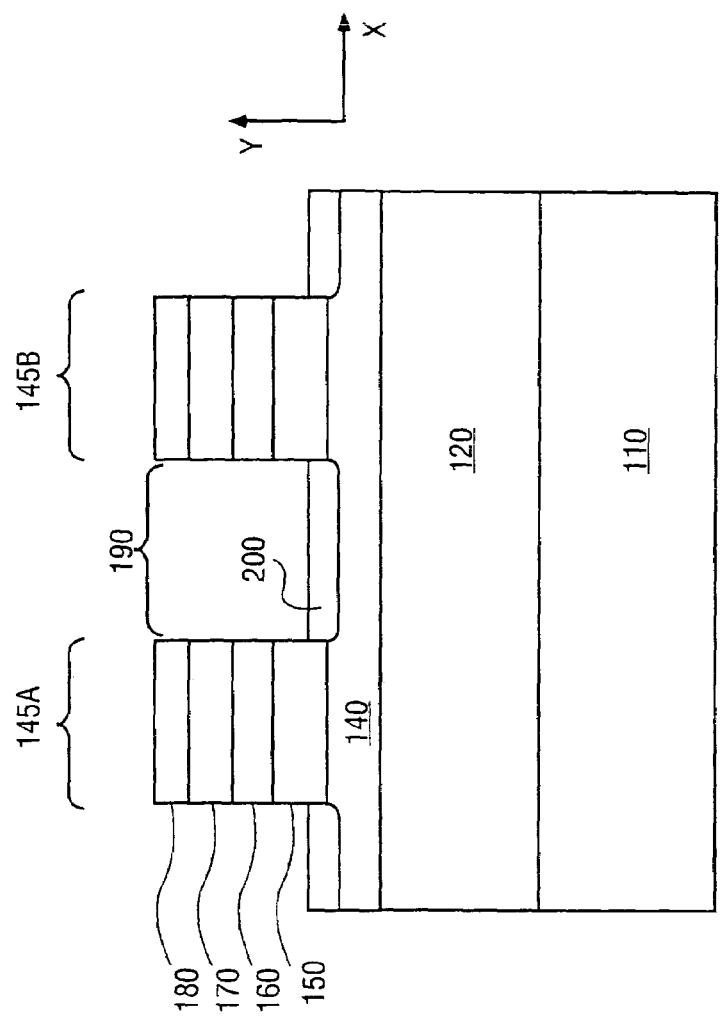
FIG. 7 shows the structure of FIG. 5, through the same cross-sectional view, after the patterning of the x-direction thickness of the semiconductor substrate structure, the formation of a second STI trench that is orthogonal to the first STI structure.

FIG. 7 shows the structure of FIG. 5 from an xy perspective after patterning of the x-direction thickness of the memory cell material to form a second trench 190 (which is in contrast to first isolation structure 130 that is disposed in a first trench). FIG. 7 shows two memory cells 145A and 145B patterned from memory cell region 135A depicted in FIG. 5. The memory cells 145A and 145B may be referred to as first and third areas, respectively, or as first and third active areas, respectively. In one embodiment, the active areas, so designated, may be diode stacks. It is understood that first area 135A and first area 145A are the same. The patterning may be accomplished using conventional techniques for etching, in this example, refractory metal silicide and silicon material to the exclusion of masking material 180. The definition of the x-direction thickness involves, in one embodiment, an etch to conductive material 150 (N-type silicon in this embodiment) of the memory line stack to define memory cells 145A and 145B of memory cell region 135A. In the case of an etch, the etch proceeds through the memory line stack to, in this example, a portion of a conductor or signal line that is in this case conductive material 150. A timed etch may be utilized to stop an etch at this point.

Following the patterning and etching of second trench 190, N-type dopant may be introduced at the base of each second trench 190 to form pockets 200 having a dopant concentration on the order of about $10^{18}$–$10^{20}$ atoms/cm$^3$ to form an N$^+$ region between memory cells 145A and 145B. Pockets 200 serve, in one sense, to maintain continuity of a row line.

Figure 8:
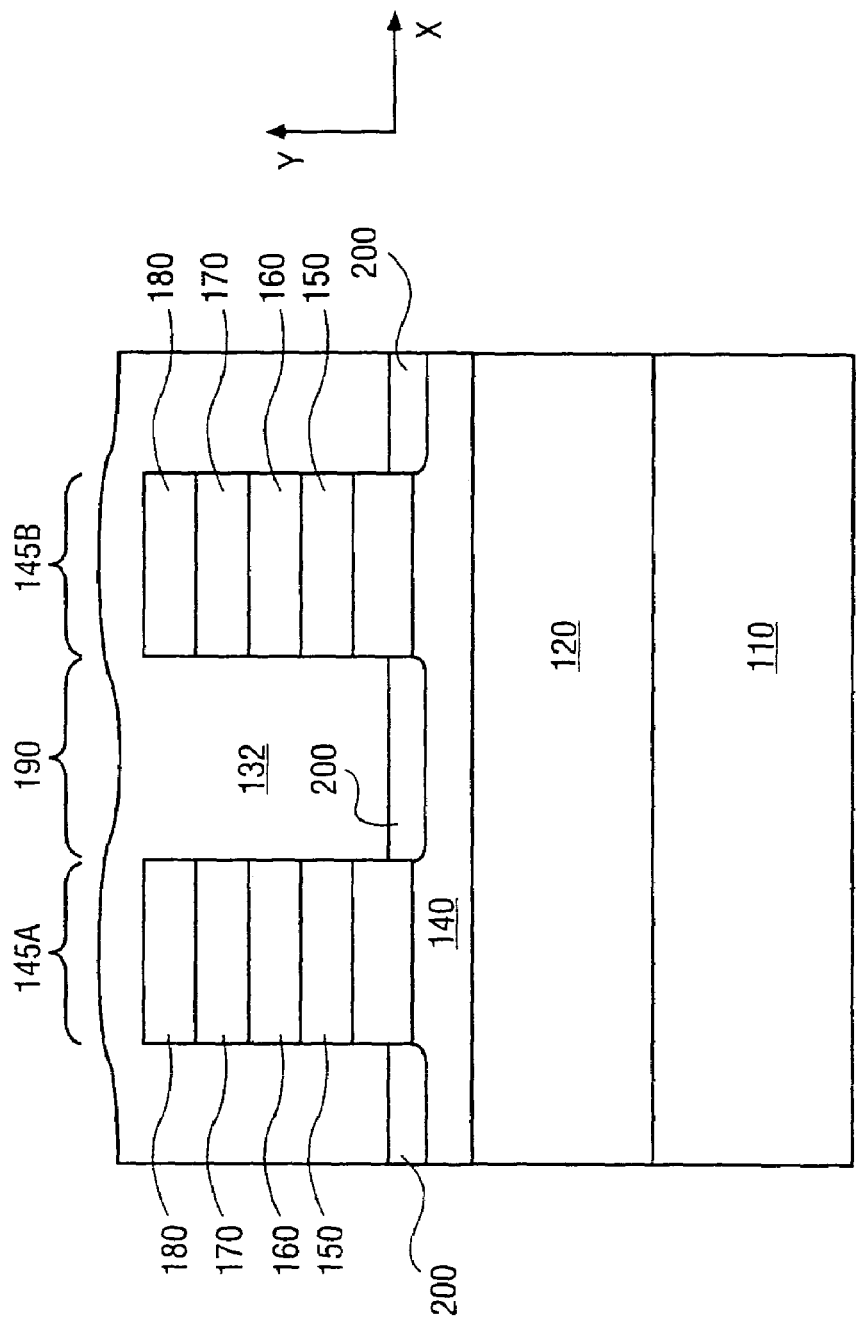
FIG. 8 shows the structure of FIG. 7, through the same cross-sectional view, after the filling of the second STI trench in accordance with one embodiment of the invention.

A second STI structure 132 is formed over substrate 100 to substantially fill second trench 190 as depicted in FIG. 8. Although reducer material 170 is depicted as being present in FIG. 8, it may be formed later, if at all, as will be set forth herein. Second STI structure 132 is formed in second isolation trench 190 in a direction that is orthogonal to first STI structure 130. Second STI structure 132 may be planarized to expose the diode stack. After planarization, both first STI structure 130 and second STI structure 132 are exposed.

As an alternative to processing, prior to the formation of first STI structure 130 and/or second STI structure 132, a thermal dielectric film (not pictured) may be formed in the respective trench(es). The thermal dielectric film(s) acts to assist with formation of the isolation structure(es).

Figure 9:
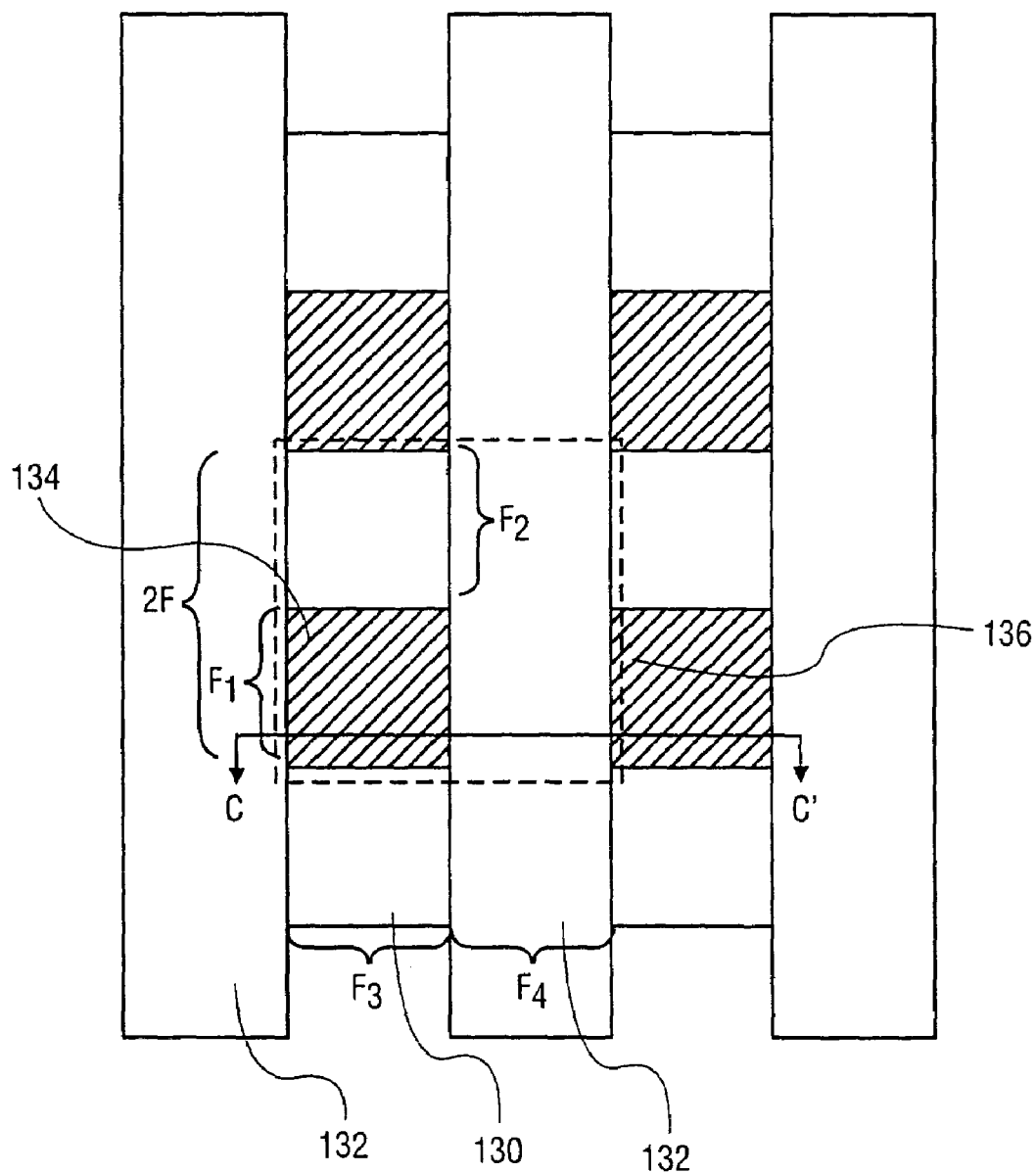
FIG. 9 is a top plan view of the structure depicted in FIG. 8 after planarization that illustrates the double trench aspect of the present invention.

FIG. 9 illustrates a top plan view of the structure achieved after planarization. First STI structure 130 is depicted as having been cut through by etching the second trench 190 (not pictured) and filling thereof to form second STI structure 132. In other words, first STI structure 130 has a discontinuous upper surface and second STI structure 132 has a substantially continuous upper surface. The line C–C' depicted in FIG. 9 delineates the cross-sectional view of the structure in FIG. 8.

A memory cell structure 134 is also depicted in FIG. 9. Memory cell structure 134 includes first area 135A. Memory cell structure 134 may have an exposed layer such as reducer material 170, or if it is not yet formed, P-type silicon portion 160 or the like. FIG. 9 illustrates substantial isolation of memory cell structure 134 wherein it is surrounded by two first STI structures 130 and two second STI structures 132. The four features of memory cell include a first feature $F_1$ that defines an edge of memory cell structure 134, a second feature $F_2$ that defines an edge of first isolation structure 130, a third feature $F_3$ that defines the other edge of memory cell structure, and a fourth feature $F_4$ that defines an edge of second isolation structure. The memory cell structure 134 is spaced apart from adjacent memory cell structures 134 by a minimum of any of the four features. In other words, the spaced-apart isolation of memory cell structure 134 is a minimum as the smallest dimension of the four-feature squared ($4F^2$) configuration. FIG. 9 also illustrates one inventive structure of the present invention wherein a $4F^2$ 136 configuration is present within the dashed line to define a unit cell of the memory device.

A memory cell feature may be defined as a minimum geometry that defines the memory cell. For example, a first feature, $F_1$ may define an edge of memory cell structure 134. A second feature, $F_2$ may define a first edge geometry of first STI structure 130. A third feature $F_3$ may define a second edge geometry of second STI structure 132. Finally, a fourth feature, $F_4$ may define an edge geometry of second STI structure 132. Where the first and second features are substantially equal, they may be designated as 2F. In any event, the first through fourth features, when defined in a rectangular configuration are designated as $4F^2$ 136.

Figure 10:
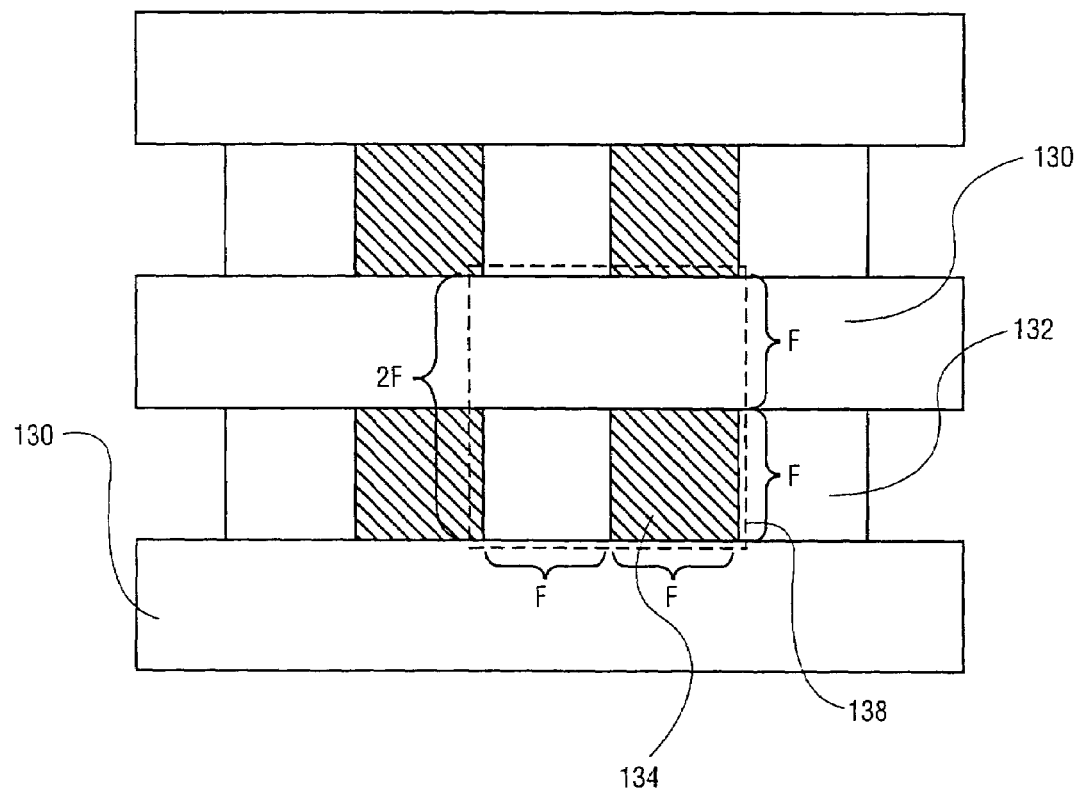
FIG. 10 is a top plan view of an alternative structure to the illustrated structure in FIG. 9 that illustrates formation of the second STI structure prior to the first STI structure, followed by planarization.

FIG. 10 illustrates another embodiment of the present invention wherein second STI structure 132 is formed before first STI structure 130. Consequently, second STI structure 132 has been cut through by first STI structure 130. In this embodiment, a similar $4F^2$ 138 structure is present within the dashed line is achieved. The memory cell structure 134 is completely isolated along two parallel first edges by second STI structure 132, and along two parallel second edges by first STI structure 130.

Figure 11:
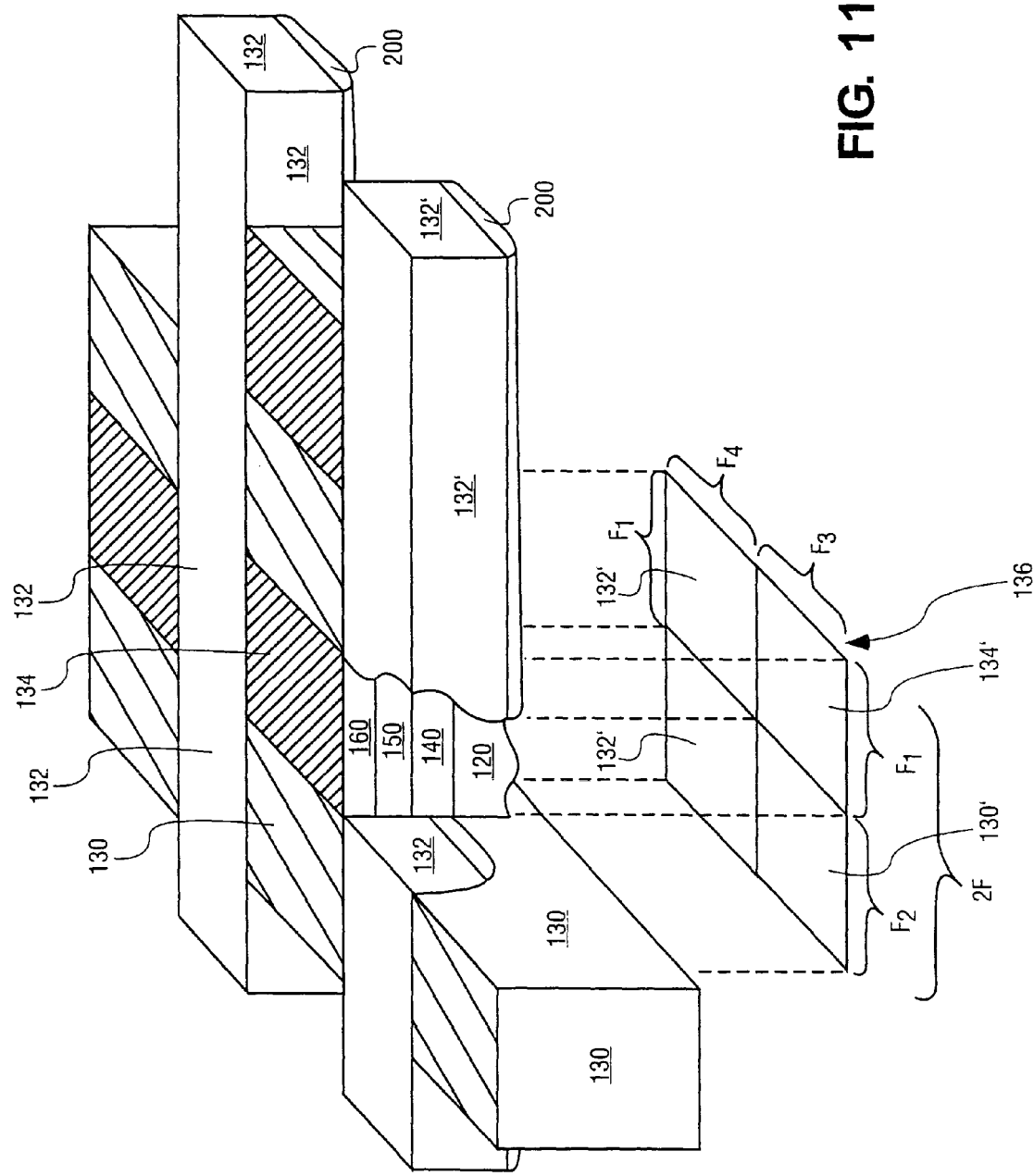
FIG. 11 is an elevational oblique view of selected structures of the inventive memory device that is depicted in FIGS. 8 and 9 after planarization.

FIG. 11 is an elevational oblique view of selected structures of the inventive memory device. In this embodiment, formation of first STI structure 130 has preceded the formation of second STI structure 132. Further, masking material 180 is not depicted in order to expose second STI structure 132. Memory cell structure 134 is exposed by a cut-away of a second STI structure 132'. Beneath the selected structures it can be seen that a projection of $4F^2$ 136 illustrates the inventive unit cell of the memory isolation. In the present invention, a double trench isolation structure has been achieved that acts to isolate the diode stack of memory cell structure 134 in all directions by a distance of at least 1F. In this embodiment, reducer material 170 has not yet been formed, and planarization has created a surface that exposes first STI structure 130, second STI structure 132, and P-type silicon portion 160.

Figure 12:
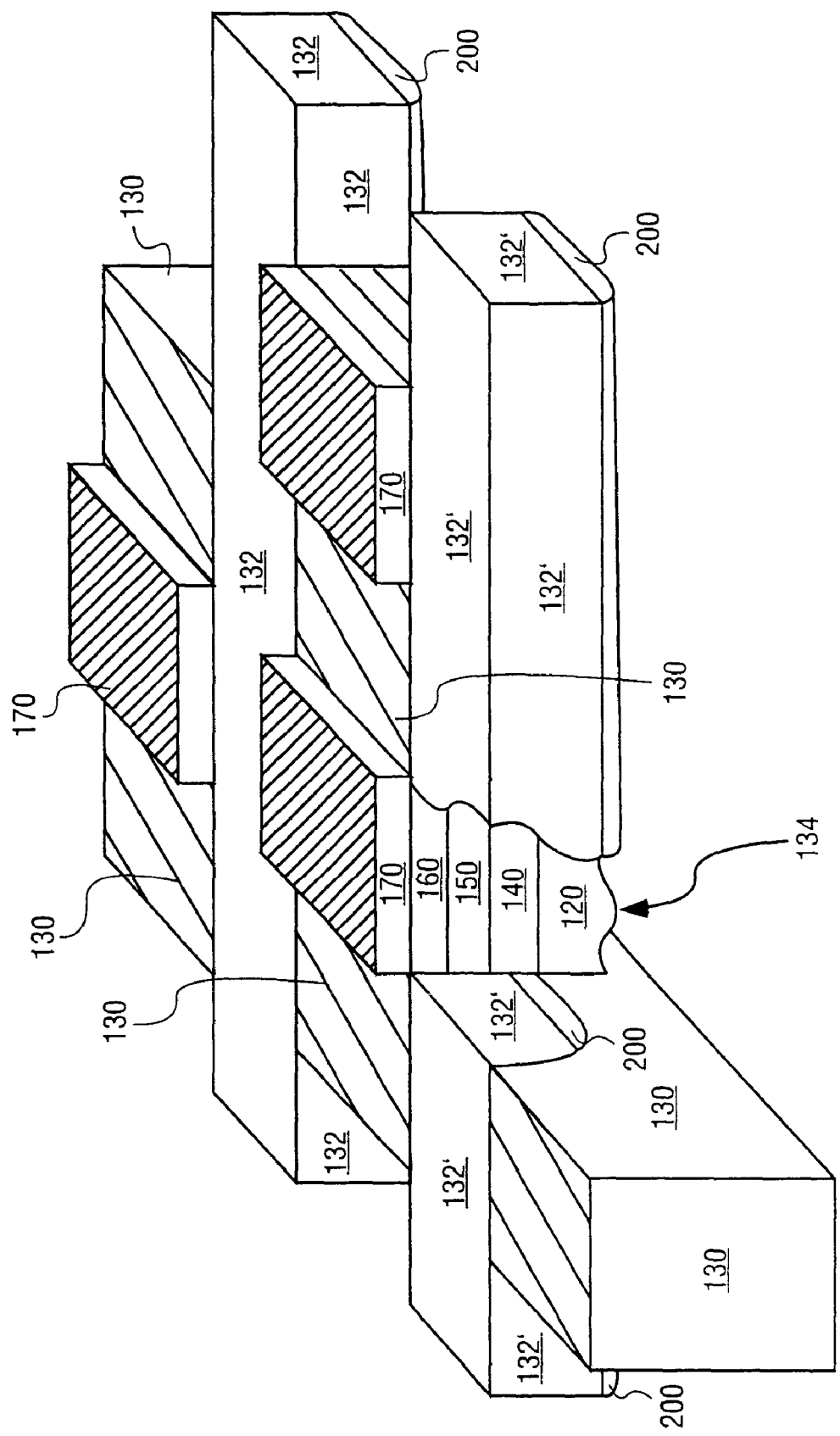
FIG. 12 is another elevational oblique view of selected structures of the inventive memory device that is depicted in FIGS. 8 and 9 after planarization and salicidation.

FIG. 12 is an elevation oblique view of the selected structures depicted in FIG. 11 after formation of a salicide of reducer material 170. Formation of a salicide of reducer material 170 may need to follow planarization of the memory device. The depths of first STI structure 130 and second STI structure may vary according to a preferred application. In one embodiment, the depth of first STI structure 130 is in a range from about 3,000 Å to about 7,000 Å. Second STI structure 132 may have a total depth in a range a range from about 500 Å to about 3,500 Å. In other words, second isolation structure 132 is shallower than first isolation structure 130. In one embodiment, the total depth of first STI structure, beginning at the bottom of reducer material 170 is about 5,300 Å, and the total depth of second STI structure 132 is about 2,500 Å.

Figure 13:
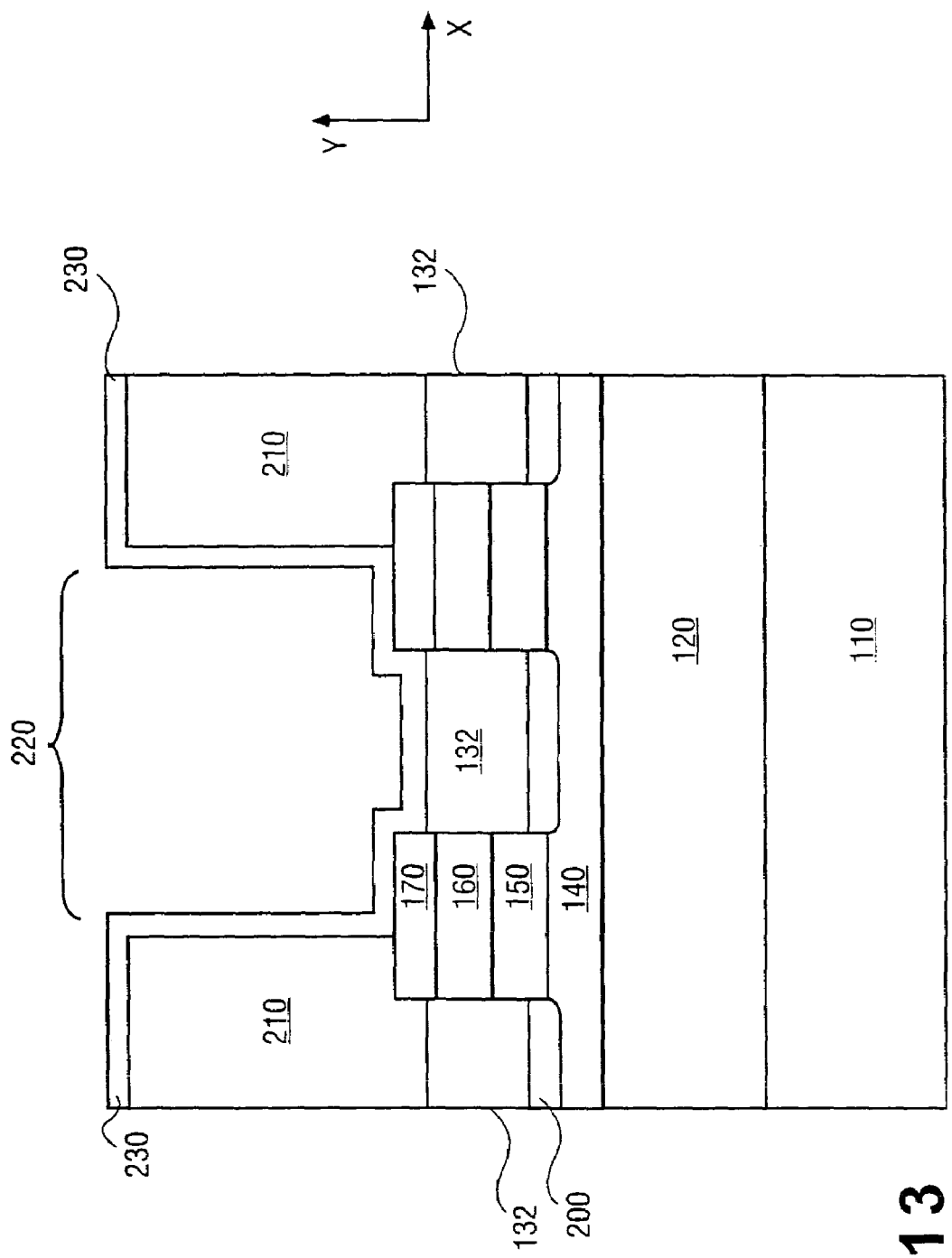
FIG. 13 shows the structure of FIG. 8 after further processing to form a reducer material and a dielectric material with a recess that communicates to the reducer material.

One aspect of the present invention involves relative depths of the STI structures. The memory cell structure 134 includes a P+Si structure 160 disposed upon an N Si structure 150. P+Si structure 160 has a top and a bottom. The N Si structure 150 also has a top and a bottom. As illustrated in FIG. 13, second STI structure 132 also has a top and a bottom; and the bottom of second STI structure 132 is below P+Si structure 160, and the top of second STI structure 132 is above the bottom of P+Si structure 160.

FIG. 13 shows the structure of FIG. 8 after planarization of second STI structure 132 and the optional salicidation formation of reducer material 170. Dielectric materials 210 are formed and the formation of a recess 220 through dielectric materials 210 is accomplished to expose reducer material 170. The formation of recess 220 may be accomplished using etch patterning with an etchant(s) for etching dielectric material 210 and selective to reducer material 170 such that reducer material 170 may serve as an etch stop. Recess 220 may be a rectangular trench or a circular contact hole.

Figure 14:
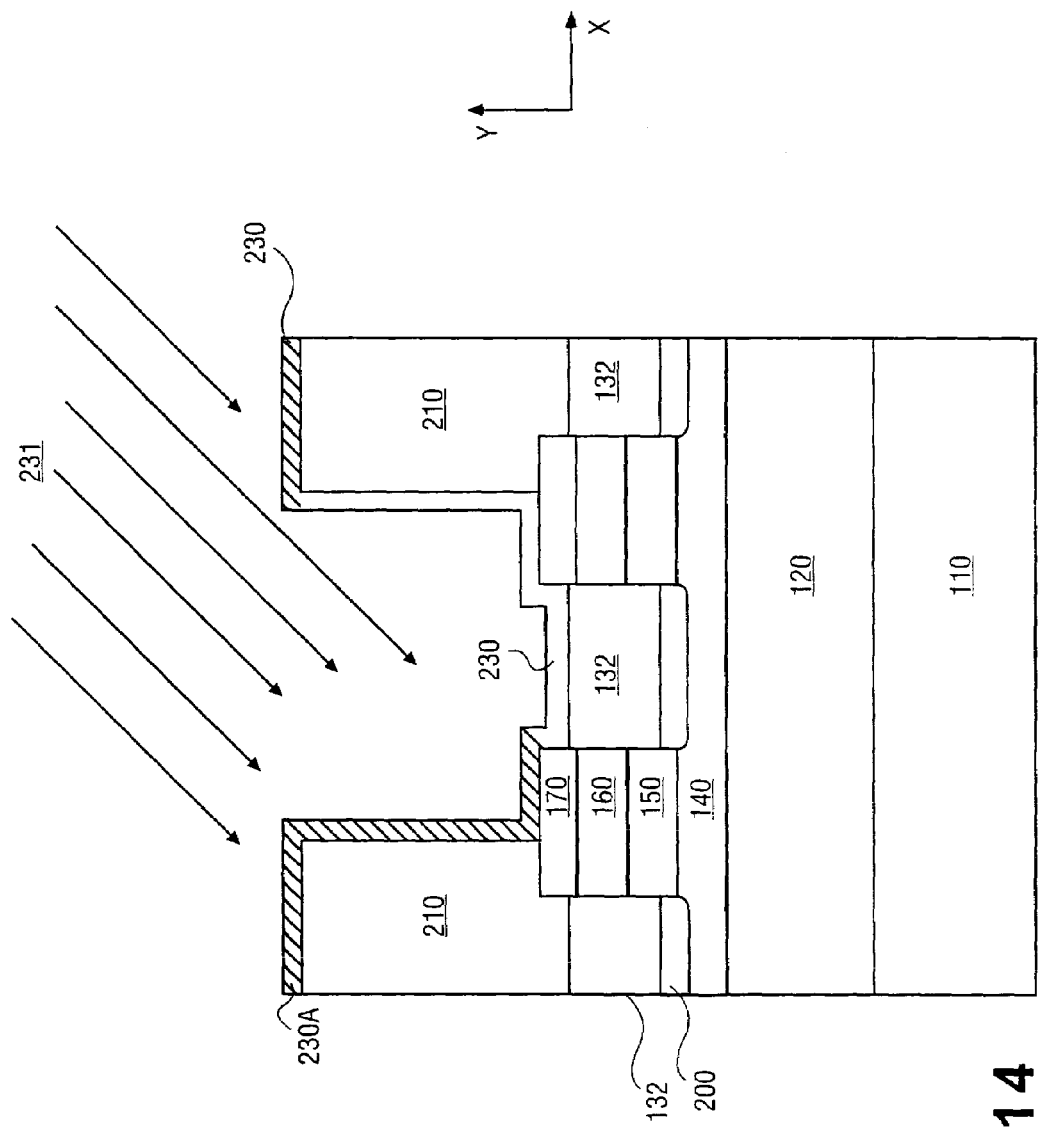
FIG. 14 shows the structure during first angled doping that leaves a portion of the electrode material undoped.

FIG. 14 illustrates the formation of a conductive film 230 in recess 220. Although second isolation structure 132 has been depicted in this disclosure, it is understood that other embodiments of the invention may be carried out without the presence of second isolation structure. In one embodiment, the conductive film is a polysilicon film 230. The conformal introduction of polysilicon film 230 that is, for example, polycrystalline silicon may follow conventional introduction techniques known to those skilled in the art including chemical vapor deposition (CVD) techniques. In the example shown, a suitable dopant is a P-typed dopant such as boron introduced to a concentration on the order of about $10^{19}$–$10^{20}$ atoms/cm$^3$.

Following the formation of recess 220 in the substrate, and following forming the polysilicon film 230, polysilicon film 230 is treated to further prepare the memory device. FIG. 14 illustrates a first portion of treating, wherein a first implantation 231 is carried out. The angle of implantation leaves the first degree of conductivity of polysilicon film 230 at the bottom of recess 220 in the region between the diode stacks and a second degree of conductivity of the first implanted polysilicon film 230A.

Figure 15:
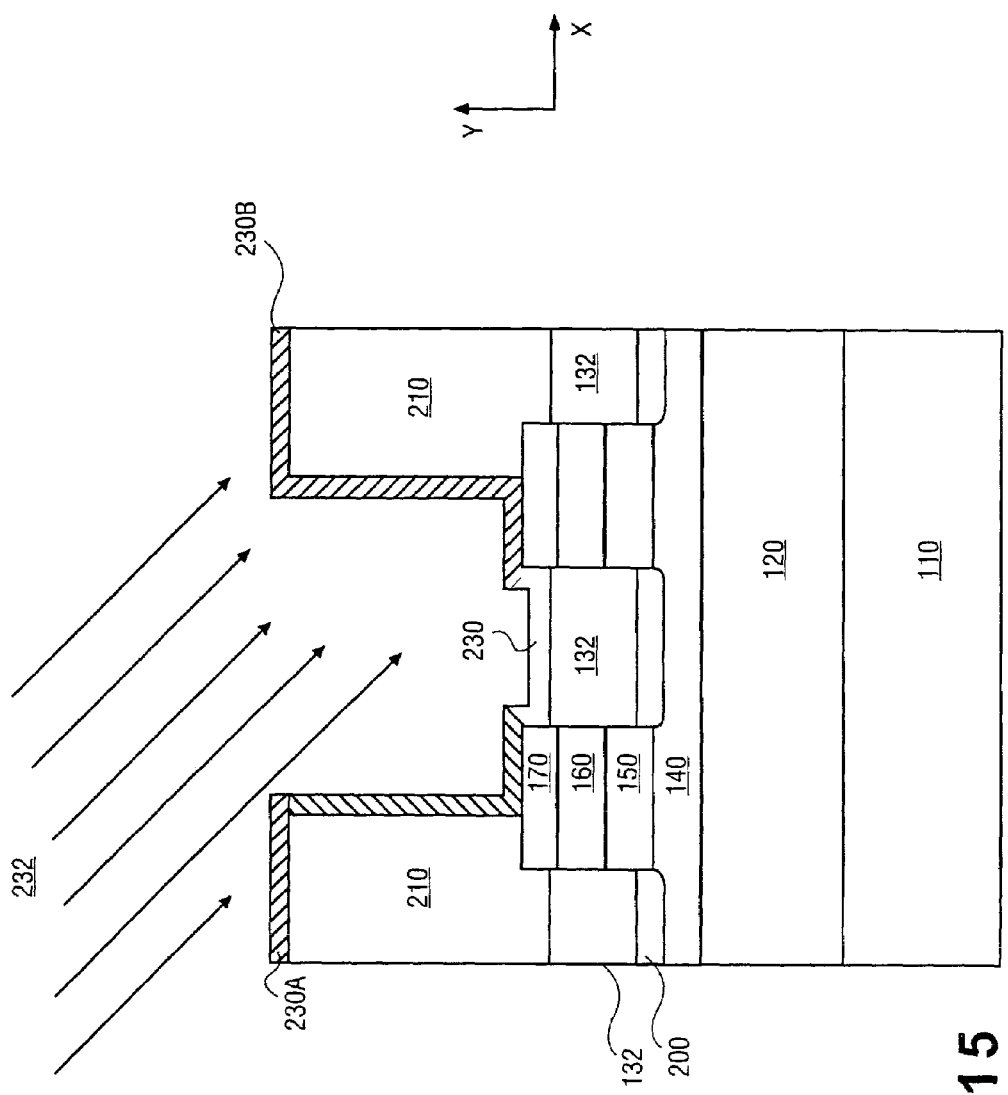
FIG. 15 shows the structure during second angled doping that is to the opposite side of the recess that also leaves a portion of the electrode material undoped.

FIG. 15 illustrates a second portion of treating, wherein a second implantation 232 is carried out. The angle of implantation again leaves the first degree of conductivity of polysilicon film 230 at the bottom of recess 220 in the region between the diode stacks and the second degree of conductivity of the second implanted polysilicon film 230B. After second implantation 232, the second conductivity may be understood to be substantially the same for both the first implanted polysilicon film 230A and the second implanted polysilicon film 230B By "substantially the same," it is meant that as an array of memory elements, operation of the array will not need to address inexact doping differences, if any are detectable.

The angled implantation or angled doping may be further treated by an activation process such as a thermal treatment that causes the doping materials to alter electrical conductivity. A dopant is introduced into the polycrystalline silicon film 230 to, in one aspect, lower the resistance of the material.

Figure 16:
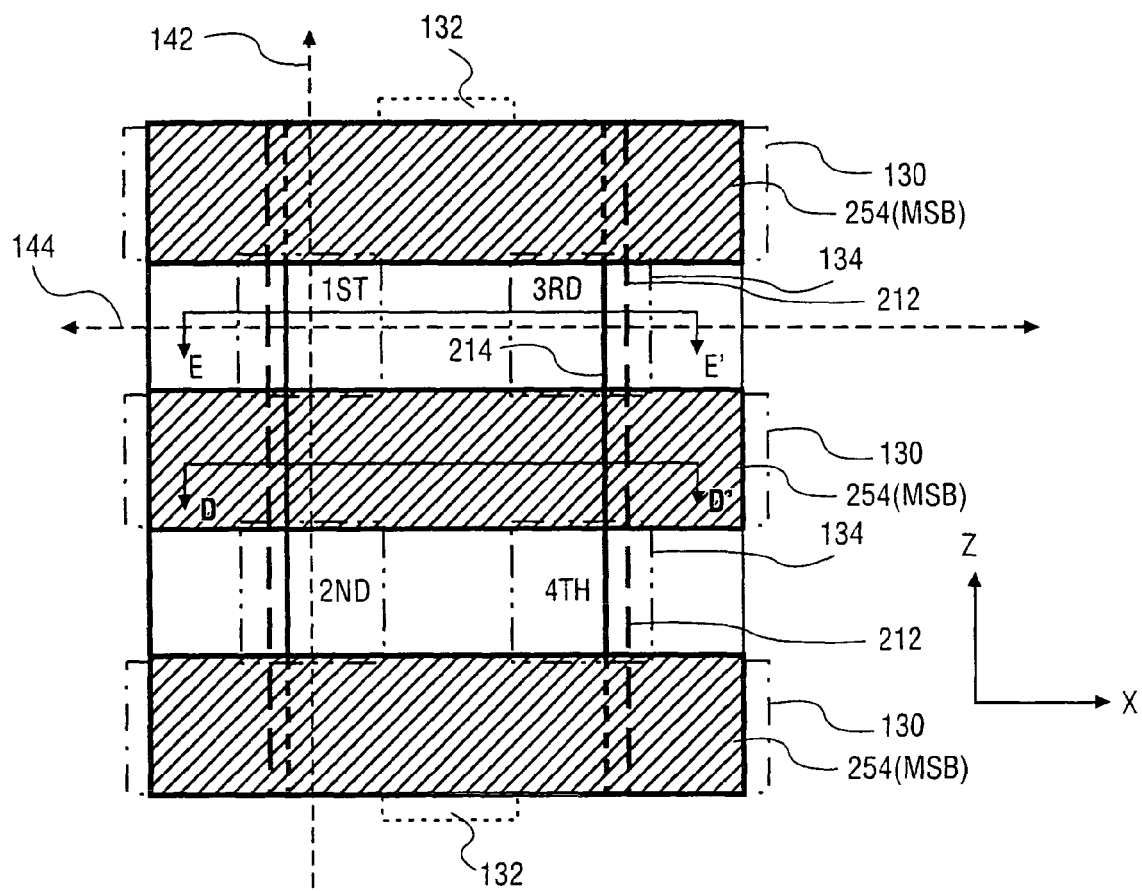
FIG. 16 is a top plan view of the structure that illustrates selective doping.

FIG. 16 illustrates the substrate in a top plan view of the X-Z layout. The first and second active areas are configured along a first symmetry line 142. The first and third active areas are configured along a second symmetry line 144. First isolation structure 130 defines spaced-apart $1^{st}$ and $2^{nd}$ areas. Second isolation structure 132 defines spaced-apart $1^{st}$ and $3^{rd}$ areas. The second symmetry line 144 also delineates the transverse axis across recess 220. The first symmetry line 142 also runs parallel with the longitudinal axis along recess 220 when recess 220 is a trench.

In one embodiment of the present invention, an etch must be carried out to singulate the polysilicon film into discrete strips in the Z-direction which is in the direction parallel to the trench shape of recess 220. This embodiment is carried out according to known process parameters. Typically, the polysilicon film singulation process may be referred to as a litho/etch process (MSK).

FIG. 16 illustrates masking that is opposite that needed to singulate polysilicon film 230 in an anisotropic etch such as MSK. Alternatively, the angled doping of polysilicon film may be carried out with mask 254. In this alternative, mask 254 and temporary material 252 are stripped and an etch recipe may be used that is selective to the doped areas such the undoped areas are removed in the etch. Etch recipes that are selective to doped areas are known in the art.

FIG. 16 illustrates the substrate in a top plan view, wherein subsurface structures are depicted in phantom lines. FIG. 16 illustrates both first dielectric structure 130 and second dielectric structure 132 as being disposed beneath the surface. FIG. 16 also illustrates the inner wall 212 of dielectric material 210 and the inner surface 214 of polysilicon film 230 that forms a polysilicon wall.

Figure 17:
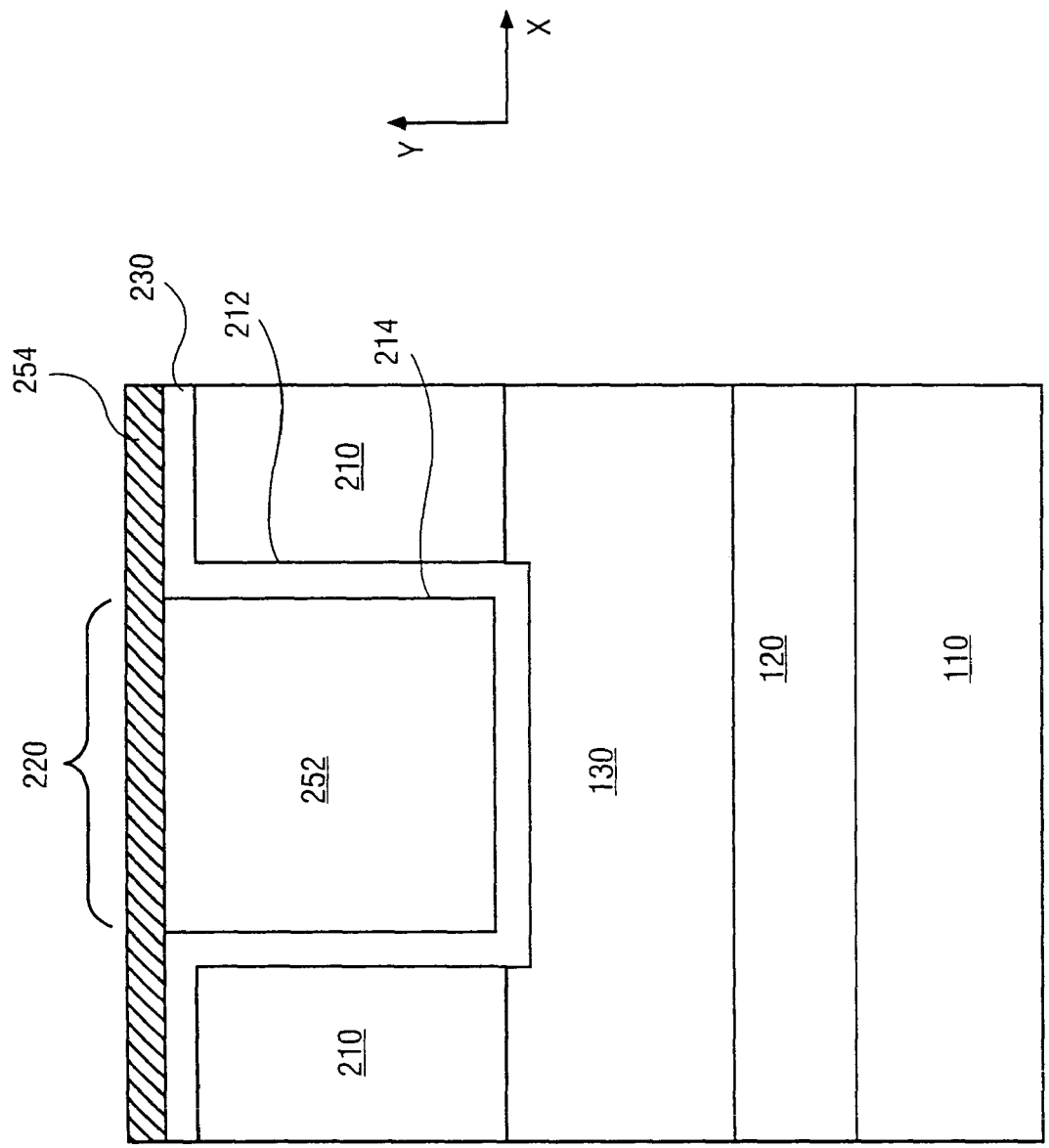
FIG. 17 is an elevational cross-section view of the structure in FIG. 16, taken along the line D–D'.

FIG. 17 is an elevational cross-section view of the substrate depicted in FIG. 16, along the section line D–D'. FIG. 17 illustrates another embodiment of the present invention in which the MSK process is supplanted with a matchstick block (MSB) process. The MSB process eliminates the impact of a polysilicon etch upon the diode stack. In this embodiment, a temporary material 252 is patterned with the assistance of a mask 254 and both first and second angled doping, as set forth above, follow the patterning of temporary material 252. Because polysilicon film 230 is unsinglated due to the presence of temporary material 252, and because of the undoped region that remains at the bottom of trench 220, the doped sections of polysilicon film form discrete isolated regions of electrically conductive material of the second conductivity type. According to this embodiment, polysilicon film 230 is substantially unsingulated, but the inventive doping process has formed discrete isolated regions of electrical conductivity. Each discrete isolated region is in electrical contact with an active area as will be further illustrated.

Figure 18:
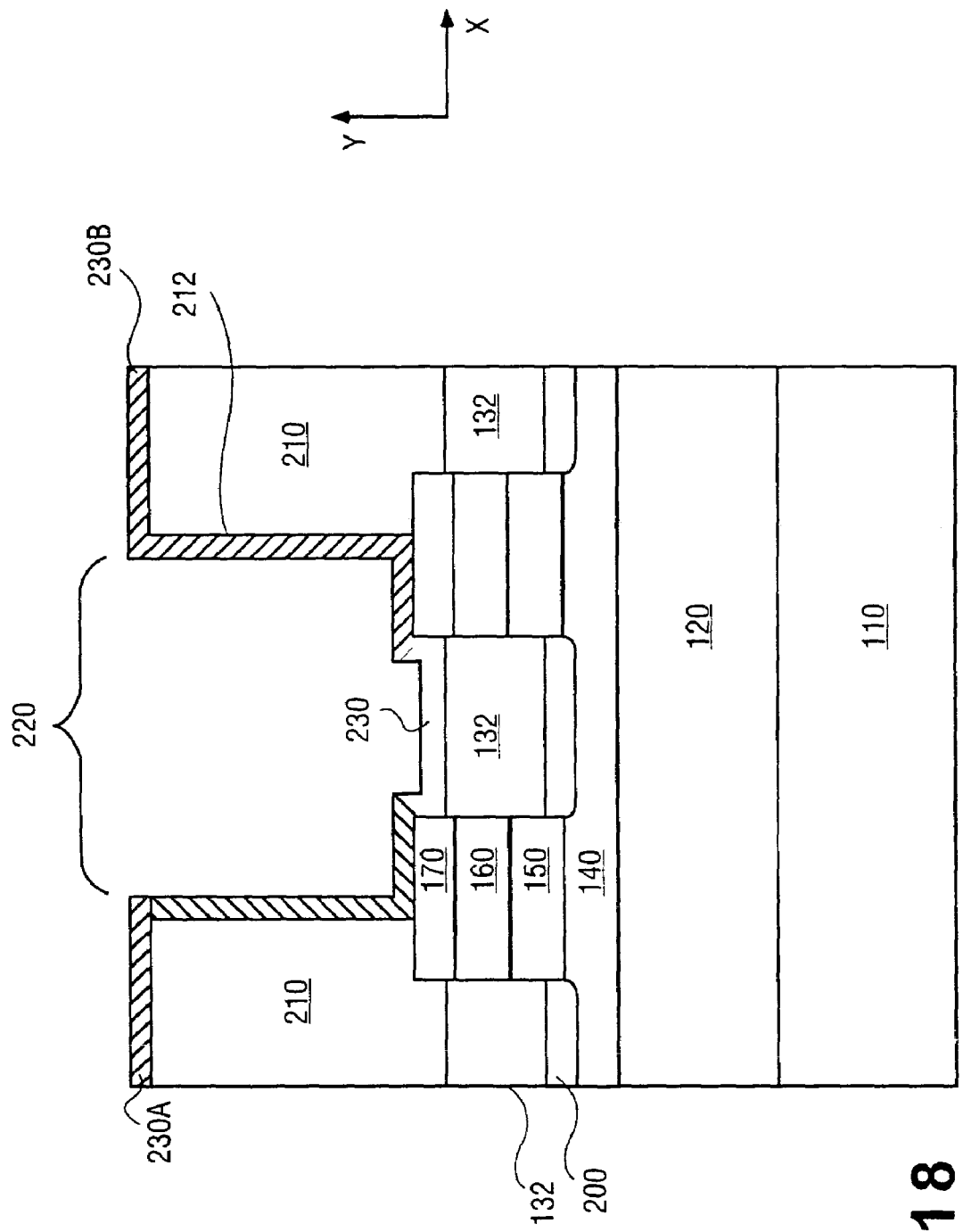
FIG. 18 is an elevational cross-section view of the structure in FIG. 16, taken along the line E–E'.

FIG. 18 is an elevational cross-section view of the substrate depicted in FIG. 16, along the section line E–E'. FIG. 18 illustrates the non-conductive polysilicon film 230 at the bottom of the trench 220 and the electrically conductive polysilicon films 230A and 230B at the walls of the recess 220 and superadjacent the active areas. Temporary material 252 has therefore been patterned to expose those portions of polysilicon film 230A and 230B that are directly above the active areas.

Figure 19:
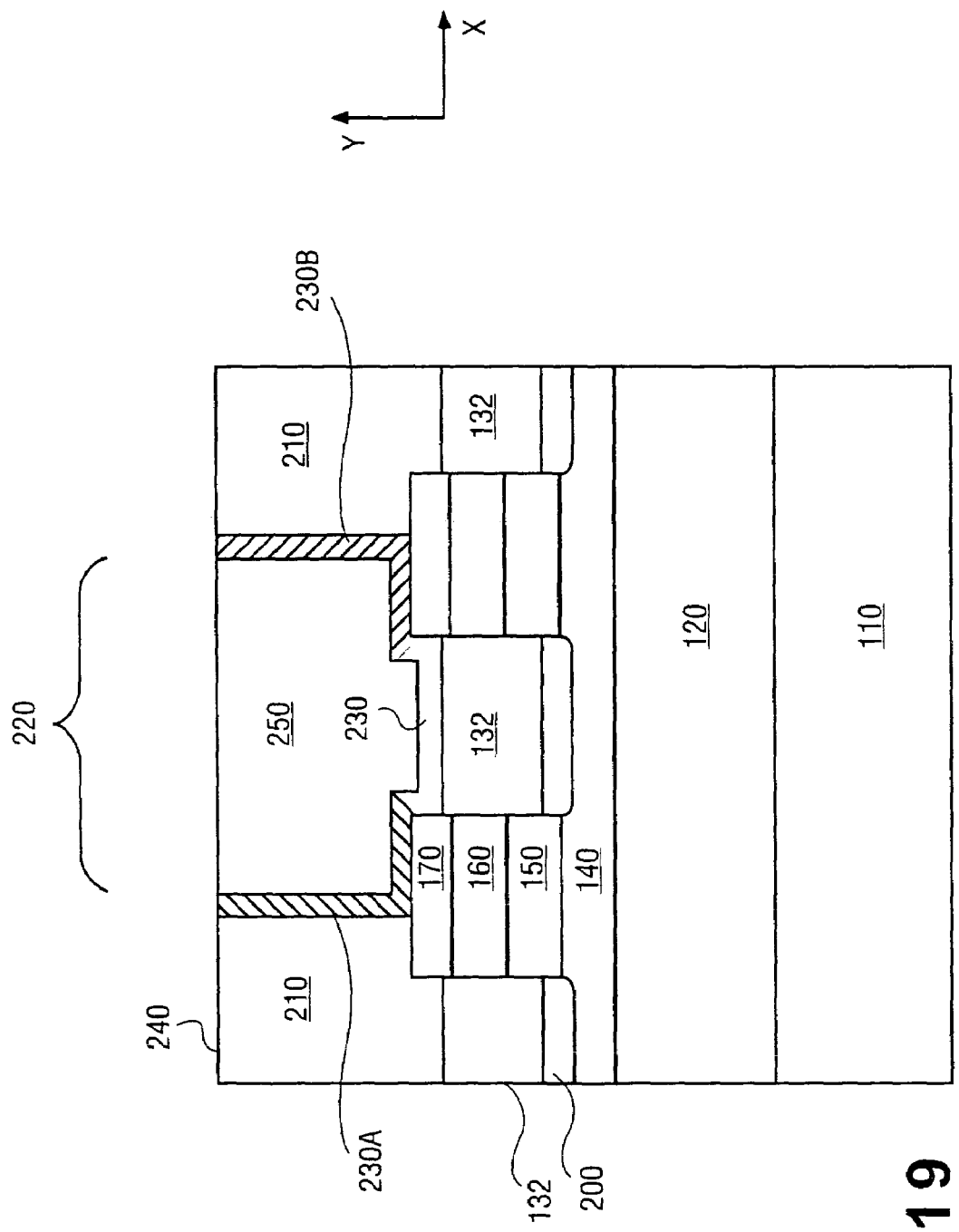
FIG. 19 shows the structure depicted in FIG. 18, through the same cross-sectional view, after fill of the recess and after planarization.

FIG. 19 illustrates further processing. Following the formation of the lower electrode, recess 220 is filled with a second dielectric 250. Second dielectric 250 may be formed by chemical vapor deposition of a silicon-containing substance selected from silicon oxide such a tetra ethyl ortho silicate (TEOS) process and the like. Following the formation of second dielectric 250, all material that resides above the top level 240 of recess 220 is removed as illustrated in FIG. 19. Removal of material may be accomplished by processes such as chemical mechanical planarization (CMP), mechanical planarization, and the like. Removal of material may be accomplished by processes such as isotropic etchback, anisotropic etchback, and the like.

Figure 20:
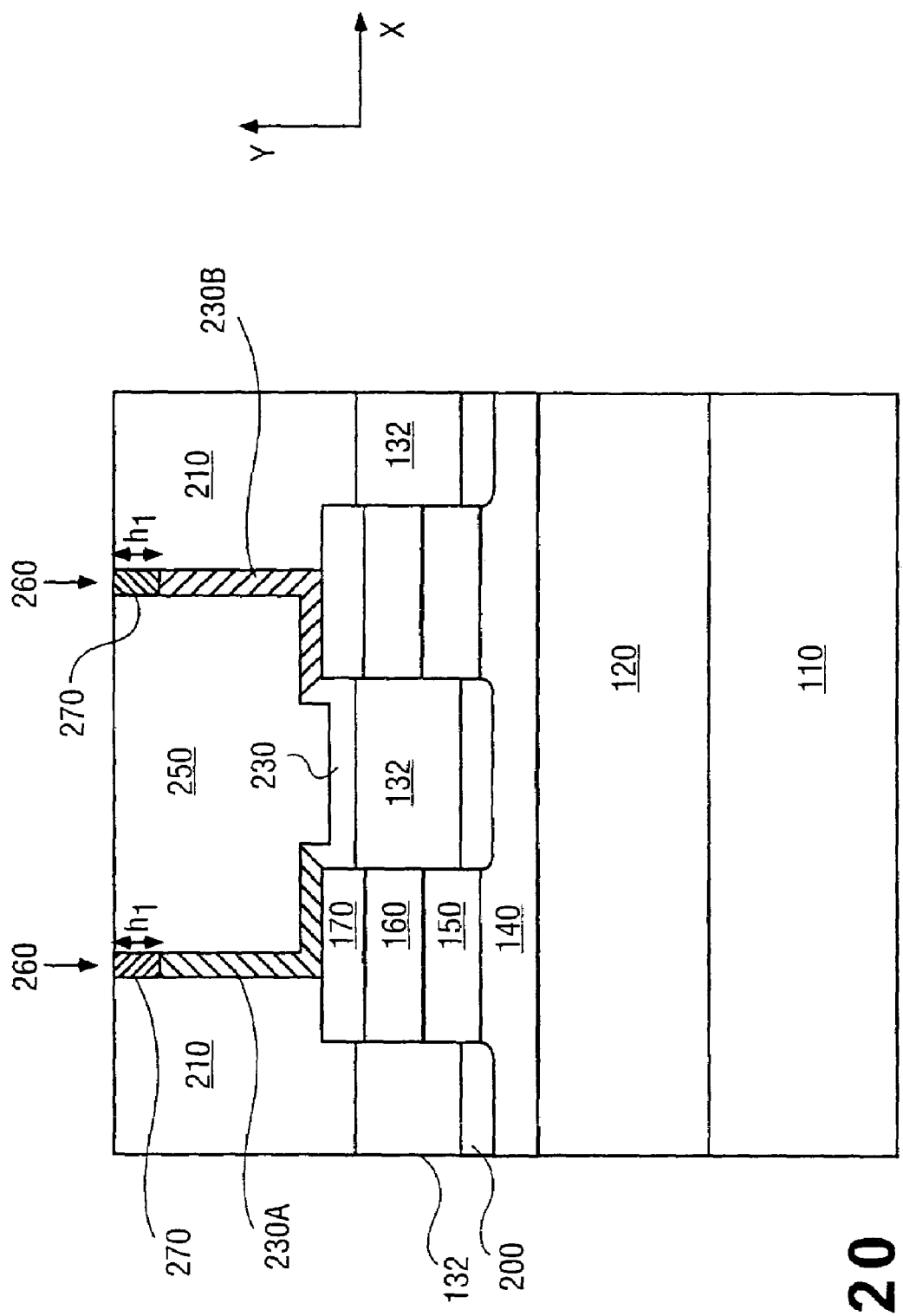
FIG. 20 shows the structure depicted in FIG. 19 after the introduction of a modifying material to the top of the electrode.

FIG. 20 shows the structure of FIG. 19 after the introduction of modifying species 260 into a portion of electrode material 230A and 230B. In one example, modifying species 260 is a chemical modifier that combines or reacts with electrode material 230A and 230B to form a different material. In the example where electrode material 230A and 230B is polycrystalline silicon, modifying species 260 includes a chemical agent that reacts or combines with silicon.

In one embodiment, modifying species 260 is introduced to raise the local resistance of electrode material 230A and 230B at a portion of electrode material 270 defined by length, $h_1$. Suitable modifiers include, but are not limited to, carbon that reacts or combines with silicon to produce silicon carbide (SiC), oxygen to form $SiO_2$ or nitrogen to form $Si_3N_4$ or $SiN_xO_y$. Where modifying species 260 is TiN, suitable modifiers include, but are not limited to, oxygen, to form $TiN_xO_y$. Electrode material 270 of SiC or $SiO_2$ generally has a higher resistivity than doped polycrystalline silicon of electrode material 230A. Suitable materials also include those materials that are introduced (e.g., added, reacted, or combined) into electrode material 230A and raise the resistivity value within the electrode (e.g., raise the local resistance near a volume of memory material), and the resistivity value is also stable at high temperatures. One measure of stability is a material's thermal coefficient of resistivity (TCR). A TCR represents a change in resistance of a material with a change in temperature. In general, semiconductor materials tend to have large negative TCRs. Polycrystalline silicon and semiconductors in general tend to significantly change their resistivity value in response to positive temperature. At high temperatures (e.g., 600 to 1200° C. or more), the resistivity of these materials decreases due to the generation of intrinsic charge carriers. Such materials may also experience thermal runaway relating to a material's stability at high temperatures. Materials with large negative TCRs may experience thermal runaway which can lead to inhomogeneous current patterns in an electrode. Thus, in one aspect, modifying species 260 is selected such that, when added, reacted, or combined with electrode material 230A, the TCR has a lower variation to positive temperature change, so that the resistivity at temperatures of 600° C. or more is stable. Lightly doped polycrystalline silicon has a larger negative TCR than more heavily doped polycrystalline silicon. While the heavily doped polycrystalline is suitable, at high temperatures (e.g., greater than 600° C.), the resistance is primarily determined by the silicon, not the dopants. Polycrystalline silicon with SiC or $SiO_2$ introduced, for example, yields an electrode material having a portion with a more stable TCR at high temperatures than polycrystalline silicon alone, likely the result of the wider conduction band associated with SiC or $SiO_2$.

In one embodiment, modifying species 260 is introduced into electrode material 230A and 230B by implantation. In one example, modifying species 260 is carbon. Carbon dioxide ($CO_2$) is introduced into an implant chamber and fractured by a plasma into species including oxygen, carbon, and carbon monoxide. With an appropriate extraction potential, the species may be directed out of the chamber where they are separated generally in terms of the species' mass/charge ratio. In this manner, the desired species may be introduced (e.g., oxygen or carbon) into electrode material 230A. In one example, oxygen is implanted at a dose of $10^{14}$–$10^{17}$ ions per square centimeter to form a concentration of electrode material 270 in the electrode on the order of about $10^{19}$–$10^{23}$ atoms/cm$^3$.

Referring to FIG. 20, modifying species 260 is introduced into electrode material 230A and 230B to form electrode material 270. FIG. 20 shows the structure having an electrode of two different material portions: electrode material 230A and 230B (e.g., doped polycrystalline silicon) and first modified electrode material 270 (e.g., polycrystalline silicon and SiC, $SiO_2$, etc.). First modified electrode material 270 is introduced into a portion of the electrode adjacent the exposed surface of the electrode. First modified electrode material 270 is selected to have a TCR with little or no change with positive temperature change so that at programming temperatures of 600° C. or more, the resistivity of first electrode material 270 does not decrease to a value lower than a resistivity at a reduced non-programming temperature. In one example, electrode material 270 has a resistivity, $R_1$, that is higher than a resistivity, $R_2$, of electrode material 230A at temperatures greater than 600° C. or at least has a thermal coefficient of resistivity that has a lower variation to positive temperature change. Modifying species 260 of oxygen, carbon, or nitrogen when introduced into polycrystalline silicon to form electrode material 270 has shown a reduced TCR compared to polycrystalline silicon, with electrode material 270 having a greater resistivity, $R_1$, at 600° C. to 650° C. than electrode material 230A of polycrystalline silicon.

The amount/depth of the first electrode material 270 generally depends on the amount of voltage that will be used to set or reset a volume of memory material. Using voltages in the range of about 3.3 volts (V) according to current technology, a suitable depth for electrode material 270 of, for example, SiC or $SiO_2$, into a polycrystalline silicon electrode is approximately 600 angstroms (Å). At lower voltages, a shorter depth would be suitable. In terms of amount of first electrode material 270, amounts of 0.1 to 20 atomic percent of modifying species 260 are suitable, 0.5 to 10 percent are preferred, and 0.5 to five percent are more preferred.

As described above, first electrode material 270 will be substantially adjacent to a volume of memory material. Because, in the embodiment described, first electrode material 270 is of a higher resistivity, the material may not provide sufficiently suitable ohmic contact between the electrode and the volume memory material for a desired application. In such cases, modifying material may be introduced into the electrode at a depth below the exposed surface of the electrode. In the example described, an electrode of polycrystalline silicon may have polycrystalline silicon at the exposed surface and first electrode material 270 at a depth below the exposed surface but not throughout or adjacent for the exposed surface (e.g., 200–1000 Å below the exposed surface). Suitable implantation energies may be formulated to establish the depth of first electrode material 270. In one example, a second introduction (e.g., deposition and doping) may also be employed to follow the introduction of modifying species 260 (to form first electrode material 270) and locate polycrystalline silicon adjacent the exposed surface of the electrode.

Figure 21:
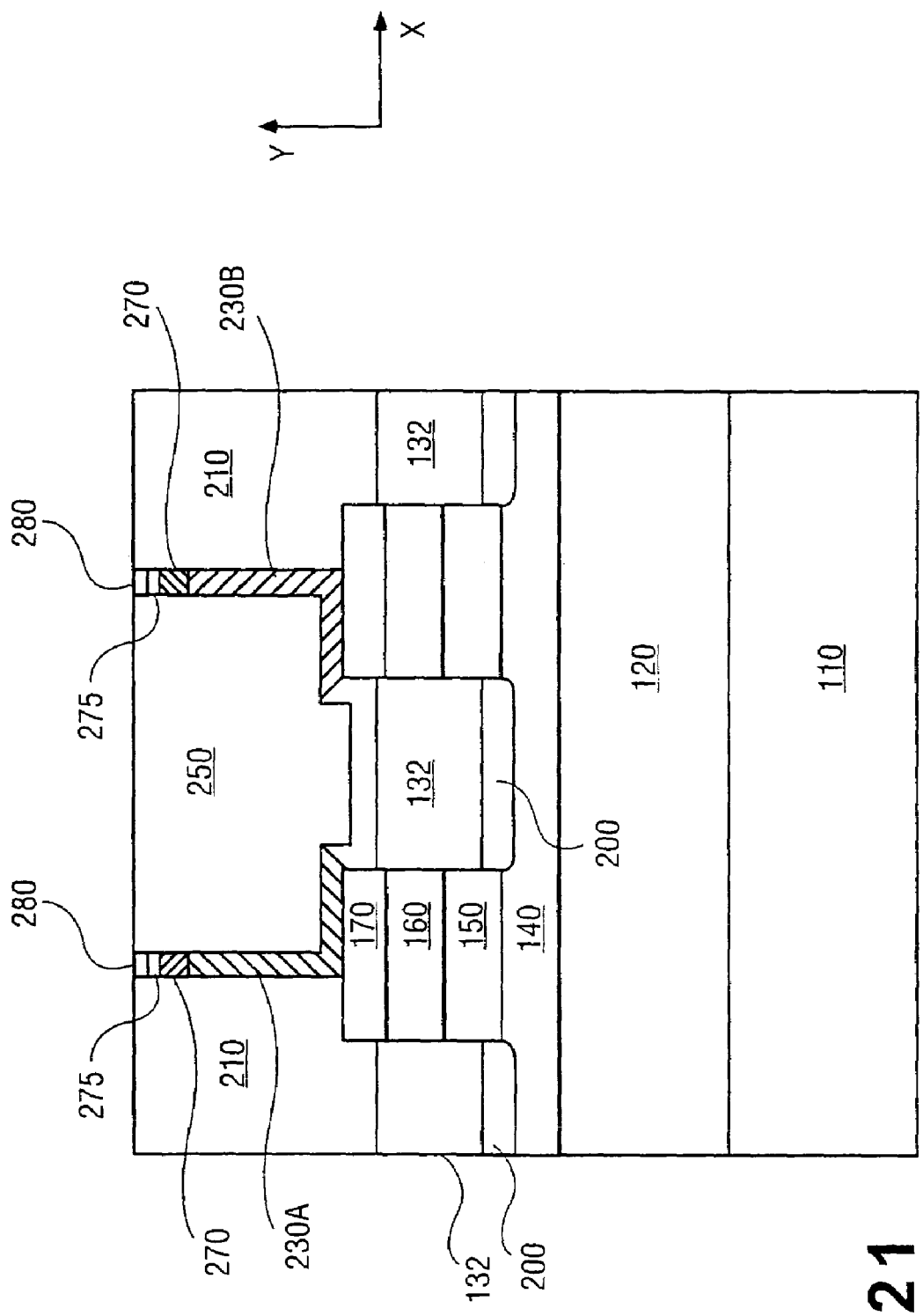
FIG. 21 shows the same structure depicted in FIG. 20 after the introduction of more modifying materials.

FIG. 21 shows the structure of FIG. 20 after the optional introduction of barrier materials 275 and 280. Barrier material 275 is, for example, titanium silicide (TiSi$_2$) introduced to a thickness on the order of about 100–300 Å. Barrier material 280 is, for example, titanium nitride (TiN) similarly introduced to a thickness on the order of about 25–300 Å. The introduction of barrier materials 275 and 280 may be accomplished using techniques known to those skilled in the art.

Figure 22:
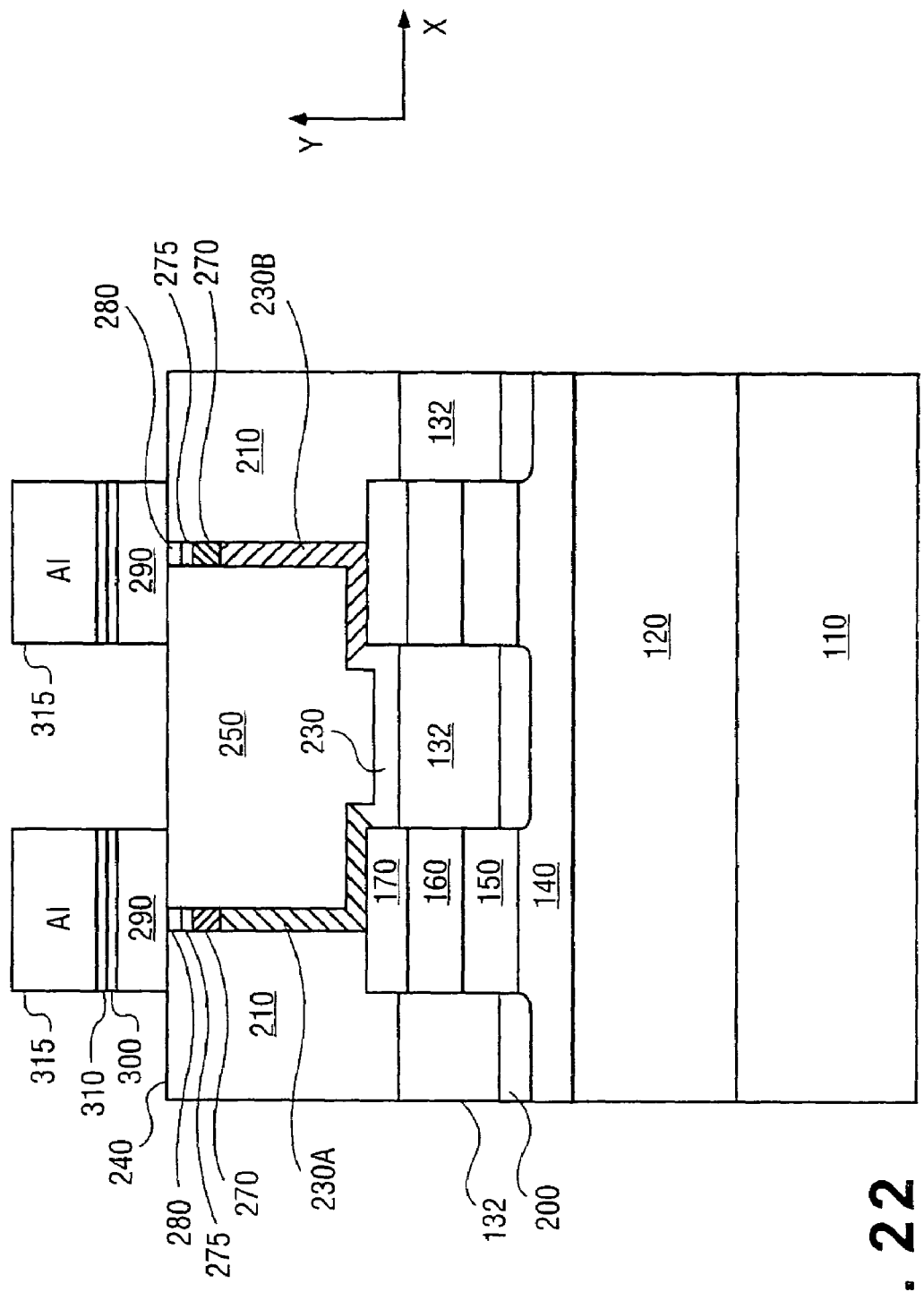
FIG. 22 shows the structure of FIG. 21, through the same cross-sectional view, after the introduction of a volume of memory material and a second conductor over the structure, in accordance with one embodiment of the invention.

FIG. 22 shows the structure of FIG. 21 after the introduction of a volume of memory material 290 (represented as memory element 30 in FIG. 1). In one example, memory material 290 is a phase change material. In a more specific example, memory material 290 includes a chalcogenide element(s). Examples of phase change memory material 290 include, but are not limited to, compositions of the class of tellerium-germanium-antimony (Te$_x$Ge$_y$Sb$_z$) material in both stoichiometric and solid-solution ratios. The volume of memory material 290, in one example according to current technology, is introduced and patterned with a thickness on the order of about 600 Å.

Overlying the volume of memory material 290 in the structure of FIG. 22 are barrier materials 300 and 310 of, for example, titanium (Ti) and titanium nitride (TiN), respectively. Barrier material serves, in one aspect, to inhibit diffusion between the volume of memory material 290 and second conductor or signal line material overlying the volume of memory material 290 (e.g., second electrode 10). Overlying barrier materials 300 and 310 is second conductor or signal line material 315. In this example, second conductor or signal line material 315 serves as an address line, a column line (e.g., column line 10 of FIG. 1). Second conductor or signal line material 315 is patterned to be, in one embodiment, generally orthogonal to first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

Figure 23:
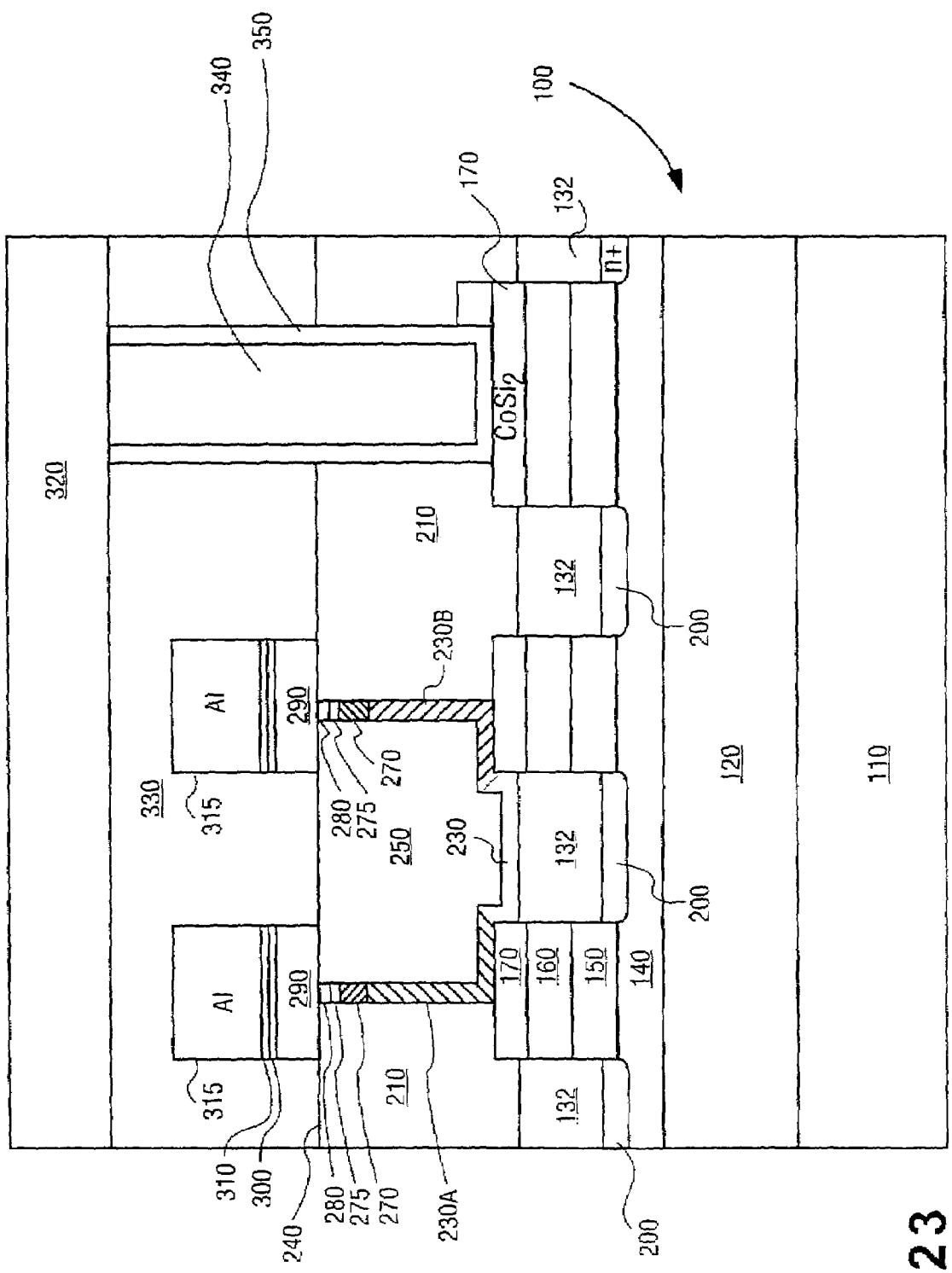
FIG. 23 shows the structure of FIG. 22, through the same cross-sectional view, after the introduction of the dielectric material over the second conductor and a third conductor coupled to the first conductor in accordance with an embodiment of the invention.

FIG. 23 shows the structure of FIG. 22 after the introduction of dielectric material 330 over second conductor or signal line material 315. Dielectric material 330 is, for example, SiO$_2$ or other suitable material that surrounds second conductor or signal line material 315 and memory material 290 to electronically isolate such structure. Following introduction, dielectric material 330 is planarized and a via is formed in a portion of the structure through dielectric material 330, dielectric material 210, and masking material 180 to reducer material 170. The via is filled with conductive material 340 such as tungsten (W) and barrier material 350 such as a combination of titanium (Ti) and titanium nitride (TiN). Techniques for introducing dielectric material 330, forming and filling conductive vias, and planarizing are known to those skilled in the art.

The structure shown in FIG. 23 also shows additional conductor or signal line material 320 introduced and patterned to mirror that of first conductor or signal line material 140 (e.g., row line) formed on substrate 100. Mirror conductor line material 320 mirrors first conductor or signal line material 140 and is coupled to first conductor or signal line material 140 through a conductive via. By mirroring a doped semiconductor such as N-type silicon, mirror conductor line material 320 serves, in one aspect, to reduce the resistance of conductor or signal line material 140 in a memory array, such as memory array 5 illustrated in FIG. 1. A suitable material for mirror conductor line material 320 includes an aluminum material, such as aluminum or an aluminum alloy.

In the above description of forming a memory element such as memory element 15 in FIG. 1, lower electrode 230A and 230B is an electrode and is described between a memory material and conductors or signal lines (e.g., row lines and column lines) that has improved electrical characteristics. In the embodiment described, the resistivity of the lower electrode 230A and 230B is reduced as set forth herein. In this manner, a supplied voltage from second conductor or signal line material 320 or first conductor or signal line material 140 to the memory material 290 may be near the volume of memory material 290 and dissipation of energy to cause a phase change may be minimized. The discussion detailed the formation of one memory element of memory array 5. Other memory elements of memory array 5 may be fabricated in the same manner. It is to be appreciated that many, and possibly all, memory elements of memory array 5, along with other integrated circuit circuitry, may be fabricated simultaneously.

Figure 24:
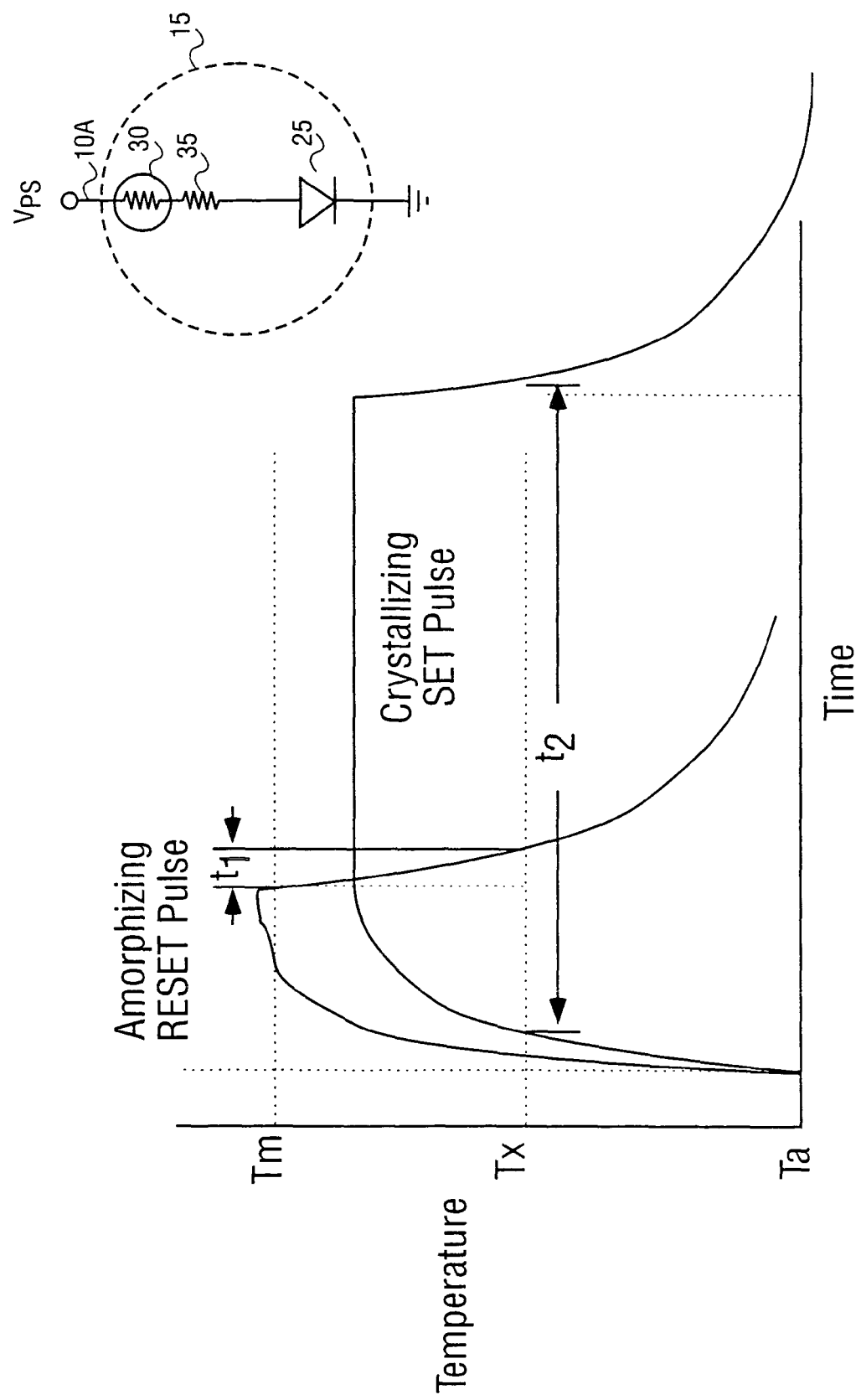
FIG. 24 shows a graphical representation of setting and resetting a volume of a phase change memory material in terms of temperature and time.

FIG. 24 presents a graphical representation of the setting and resetting of a volume of phase change memory material. Referring to FIG. 1, setting and resetting memory element 15 (addressed by column line 10a and row line 20a) involves, in one example, supplying a voltage to column line 10a to introduce a current into the volume of memory material 30 as illustrated in FIG. 1 or memory material 290 as illustrated in FIG. 12. The current causes a temperature increase at the volume of memory material 30. Referring to FIG. 24, to amorphize a volume of memory material, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 24 shows memory cell 15 having an electrode with modified portion 35 (illustrated as a resistor) to concentrate heat (current) at the volume of memory material 30.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

Distinct advantages exist for the present invention. Because of the doping scheme provided in the present invention, a double-wide trench with a polysilicon film disposed therein will form isolated discrete sections of conductivity, and by a process flow that is simplified over and etch process flow to remove nonconducting polysilicon.

Because the memory cell structure 134 may be isolated by orthogonal trenches, the likelihood of cross talk between adjacent memory cell structures is reduced. Another advantage to the present invention is that trench depths may be on the order from about 3,000 Å to about 7,000 Å and second STI structure 132 may have a total depth in a range a range from about 500 Å to about 3,500 Å. Trench depths are limited by etch time constraints. Another advantage is that the $4F^2$ configuration is easily scalable and a simplifying portion to integrate with design rules as geometries continue to reduce, for example from 0.35 $\mu$M, 0.25 $\mu$M, 0.18 $\mu$M, 0.13 $\mu$M, 0.11 $\mu$M, etc. Another advantage to the present invention is the degree of the vertical beta in the diode stack. Another advantage of the present invention is the retention of a delta in the TCR of lower electrode 230A and 230B and the TCR in the upper regions 270, 275, and 280 thereof, such that at high operating temperatures, a significant heating in the upper regions occurs in comparison to the lower regions.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   forming a recess having a bottom and a wall;
   forming an electrically resistive film in the recess to form a heater; and
   treating the film to have different electrical conductivity at the bottom and the wall; and
   forming a phase change material over said wall.

2. The process according to claim 1, wherein treating includes implanting the film at a first angle and implanting the film at a second angle different from the first angle.

3. The process according to claim 1, wherein treating further comprises doping the film to form discrete isolated regions.

4. The process according to claim 1, before treating, further comprising:
   forming a temporary material in the recess; and
   patterning the temporary material to expose the film.

5. The process according to claim 1, before treating, further comprising:
   forming a temporary material in the recess;
   patterning a mask over the temporary material; and
   removing a portion of the temporary material to expose the film.

* * * * *